US012575131B2

(12) United States Patent
Nakata

(10) Patent No.: US 12,575,131 B2
(45) Date of Patent: Mar. 10, 2026

(54) POWER SEMICONDUCTOR DEVICE WITH GATE HAVING V-GROOVE UPPER SURFACE AND METHOD OF MANUFACTURING THEREOF

(71) Applicant: Mitsubishi Electric Corporation, Tokyo (JP)

(72) Inventor: Kazunari Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 689 days.

(21) Appl. No.: 17/796,786

(22) PCT Filed: Apr. 14, 2021

(86) PCT No.: PCT/JP2021/015421
§ 371 (c)(1),
(2) Date: Aug. 1, 2022

(87) PCT Pub. No.: WO2021/210600
PCT Pub. Date: Oct. 21, 2021

(65) Prior Publication Data
US 2023/0048355 A1 Feb. 16, 2023

(30) Foreign Application Priority Data

Apr. 17, 2020 (JP) ................................. 2020-073832

(51) Int. Cl.
*H10D 30/66* (2025.01)
*H02M 1/08* (2006.01)
(Continued)

(52) U.S. Cl.
CPC ............ *H10D 30/668* (2025.01); *H02M 1/08* (2013.01); *H10D 12/031* (2025.01);
(Continued)

(58) Field of Classification Search
CPC .............. H10D 30/668; H10D 64/518; H10D 62/8325; H10D 62/393; H10D 12/031; H02M 1/08; H02M 7/53871; H02P 27/08
See application file for complete search history.

(56) References Cited

U.S. PATENT DOCUMENTS 5,506,421 A * 4/1996 Palmour ............ H10D 62/8325
257/341
6,133,587 A * 10/2000 Takeuchi ........... H10D 30/0297
257/77

(Continued)

FOREIGN PATENT DOCUMENTS

JP H08505492 A 6/1996
JP 2017126630 A 7/2017
(Continued)

OTHER PUBLICATIONS

English translation of JP 2017195333 (Year: 2017).*
(Continued)

*Primary Examiner* — Lex H Malsawma
(74) *Attorney, Agent, or Firm* — Buchanan Ingersoll & Rooney PC

(57) ABSTRACT

An object of the present disclosure is to provide a trench gate type power semiconductor device that does not easily break even when stress is applied. A SiC-MOSFET includes a SiC substrate, a drift layer of a first conductive type, formed on the SiC substrate, a base region of a second conductivity type formed in a surface layer of the drift layer, a source region of the first conductivity type selectively formed in a surface layer of the base region, a trench extending through the base region and the source region and reaching the drift layer, a gate electrode embedded in the trench and having a V-shaped groove on an upper surface thereof, and an oxide film formed on an upper surface including the groove of the
(Continued)

gate electrode, in which a bottom of the V-shape groove is deeper than the base region.

11 Claims, 28 Drawing Sheets

(51) Int. Cl.

| | | |
|---|---|---|
| H10D 12/01 | (2025.01) | |
| H10D 62/17 | (2025.01) | |
| H10D 62/832 | (2025.01) | |
| H10D 64/27 | (2025.01) | |
| *H02M 7/5387* | (2007.01) | |
| *H02P 27/08* | (2006.01) | |

(52) U.S. Cl.
CPC ....... H10D 62/393 (2025.01); H10D 62/8325 (2025.01); H10D 64/518 (2025.01); *H02M 7/53871* (2013.01); *H02P 27/08* (2013.01)

(56) References Cited

U.S. PATENT DOCUMENTS

| | | | | |
|---|---|---|---|---|
| 2009/0179227 A1* | 7/2009 | Otake | .................. | H10D 30/668 |
| | | | | 257/E21.441 |
| 2009/0321854 A1* | 12/2009 | Ohta | .................. | H10D 30/0297 |
| | | | | 257/411 |
| 2013/0153995 A1* | 6/2013 | Misawa | ............... | H10D 12/481 |
| | | | | 438/270 |
| 2014/0252374 A1* | 9/2014 | Wada | ................... | H10D 62/157 |
| | | | | 257/77 |
| 2016/0027878 A1* | 1/2016 | Uchida | .............. | H10D 30/0297 |
| | | | | 257/77 |
| 2017/0200805 A1 | 7/2017 | Takei | | |
| 2017/0207311 A1* | 7/2017 | Masuda | ................ | H01L 21/046 |
| 2018/0331204 A1* | 11/2018 | Aichinger | ........... | H10D 30/668 |
| 2019/0172943 A1 | 6/2019 | Sakai et al. | | |
| 2019/0259841 A1 | 8/2019 | Stegner et al. | | |
| 2020/0091299 A1* | 3/2020 | Nakamata | .............. | H10D 64/01 |
| 2020/0203513 A1* | 6/2020 | Konrath | .............. | H10D 12/038 |

FOREIGN PATENT DOCUMENTS

| | | | | | |
|---|---|---|---|---|---|
| JP | 2017195333 A | | 10/2017 | | |
| JP | 2017204575 A | | 11/2017 | | |
| JP | 2019145791 A | | 8/2019 | | |
| JP | 2019192699 A | * | 10/2019 | .......... | H10D 64/519 |
| JP | 2020047676 A | | 3/2020 | | |
| WO | 9413017 A1 | | 6/1994 | | |
| WO | WO-2008023738 A1 | * | 2/2008 | ............. | H10D 84/01 |

OTHER PUBLICATIONS

English translation of JP-2019-192699A (Year: 2019).*

International Search Report (PCT/ISA/210) with translation and Written Opinion (PCT/ISA/237) mailed on Jul. 6, 2021, by the Japan Patent Office as the International Searching Authority for International Application No. PCT/JP2021/015421. (12 pages).

First Office Action dated Jun. 12, 2025, issued in the corresponding Chinese Patent Application No. 202180025233.5, 17 pages including 9 pages of English Translation.

Office Action issued in DE Application No. 112021002411.6 Mailed on Dec. 23, 2025 and English Translation (13 Pages).

* cited by examiner

F I G. 1
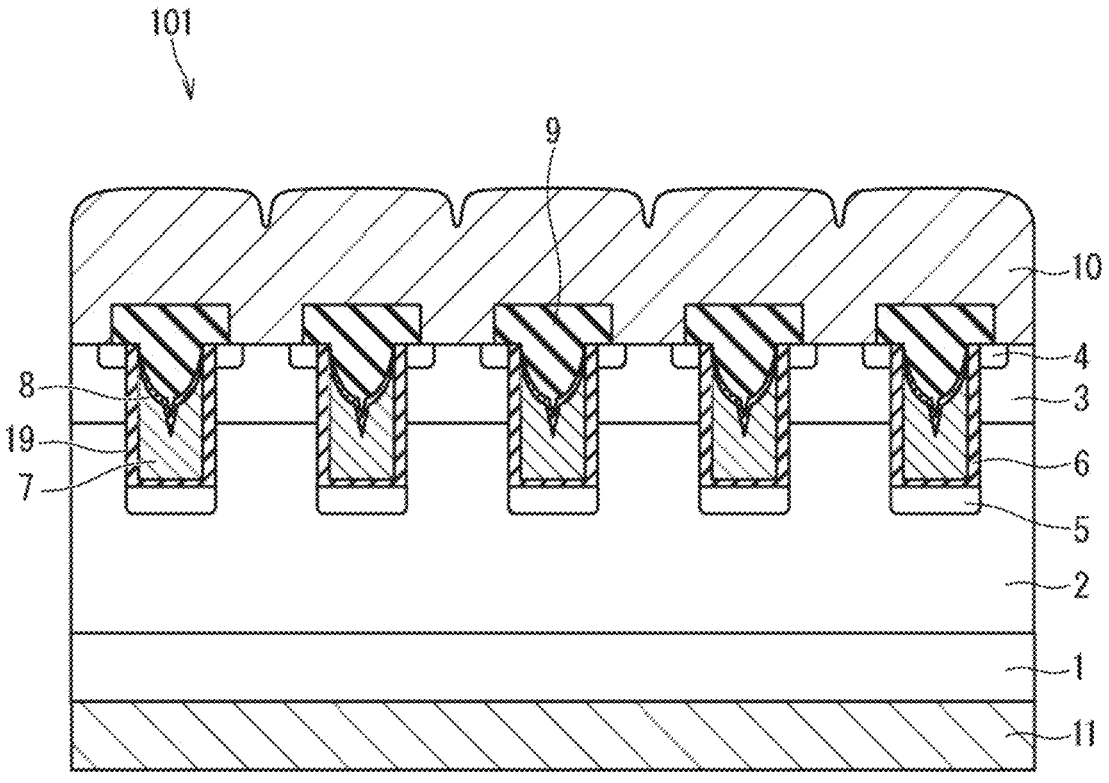

F I G. 2
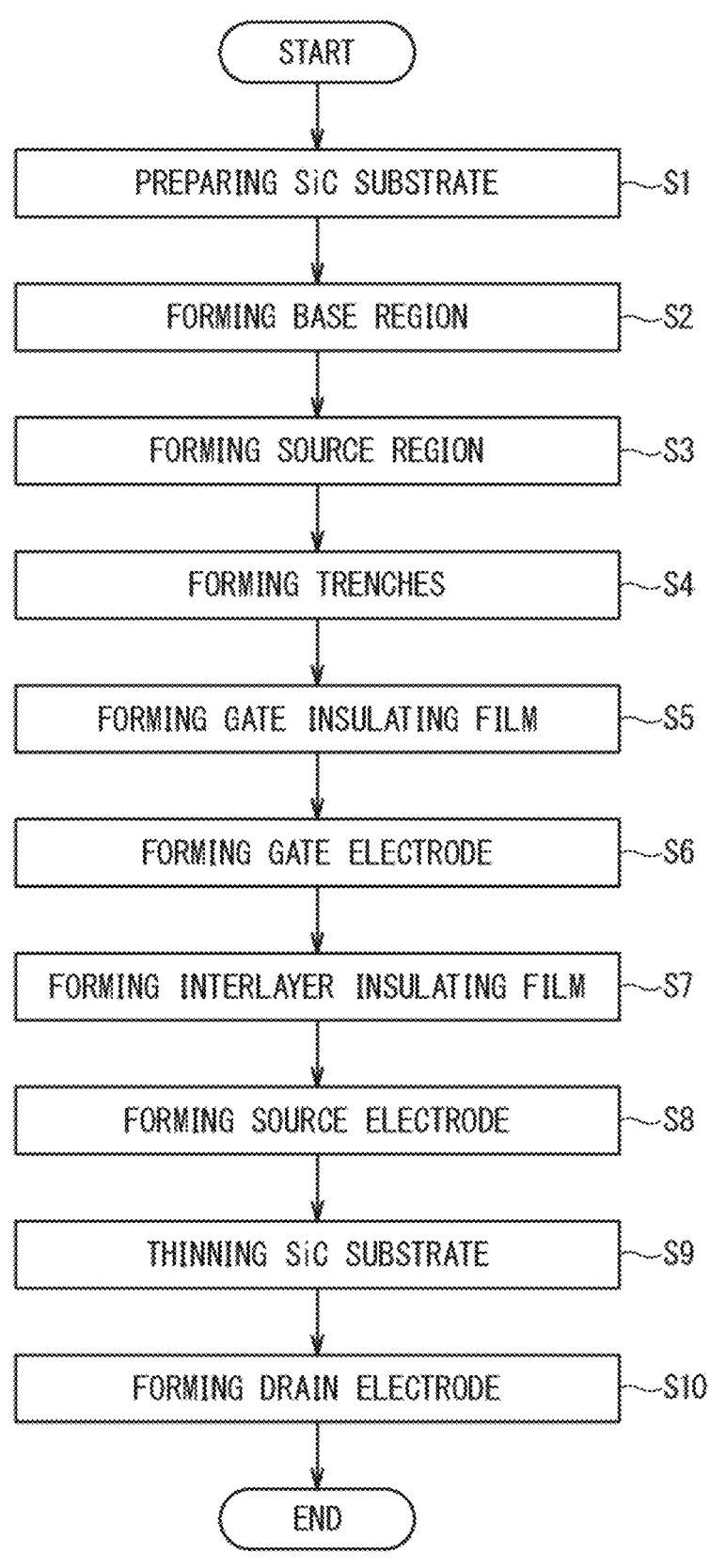

F I G.  4
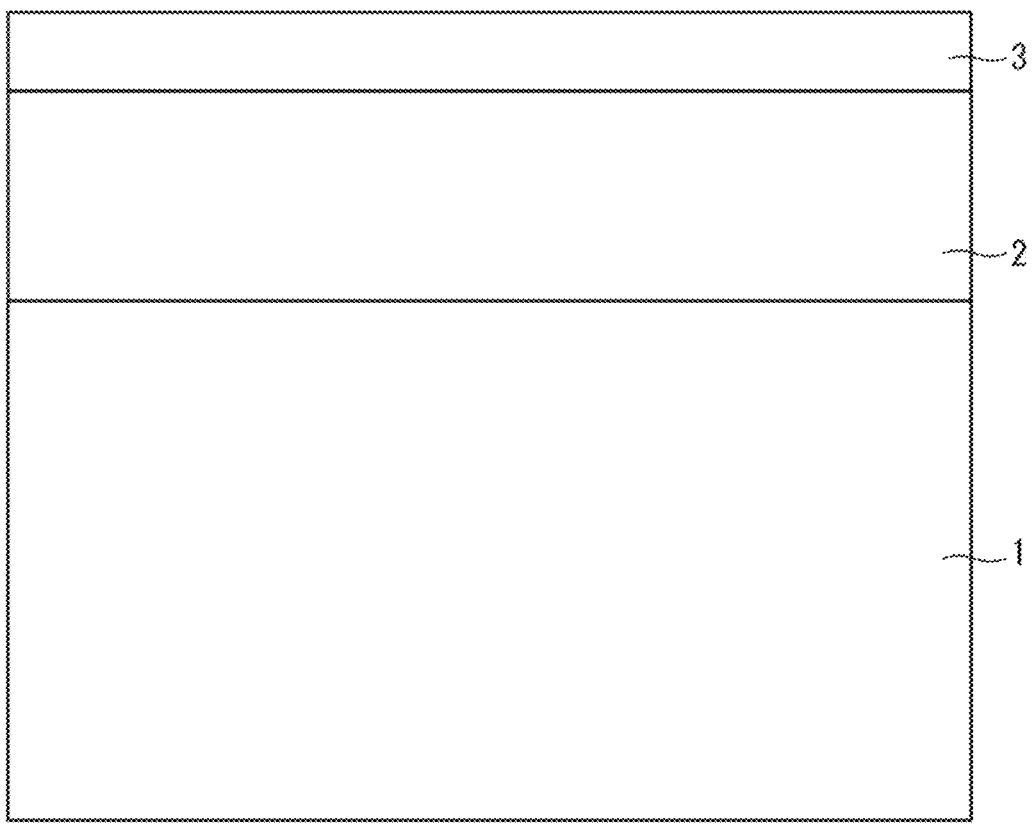

F I G. 7
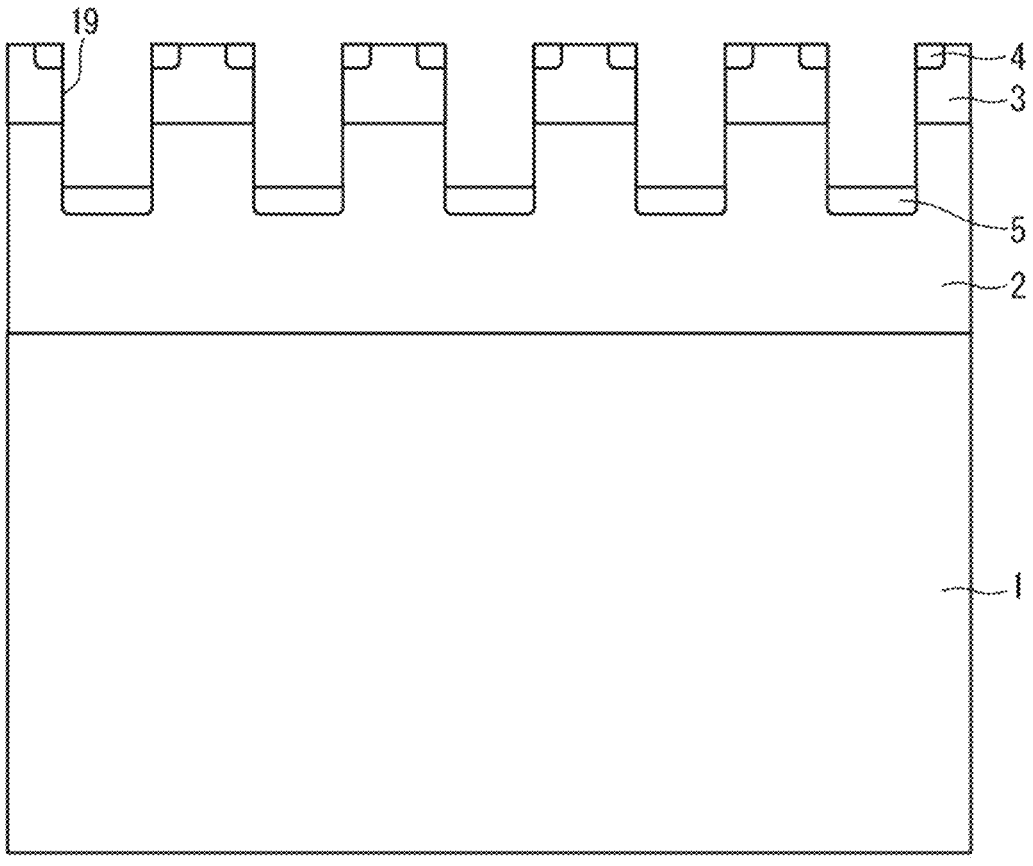

F I G . 3 2
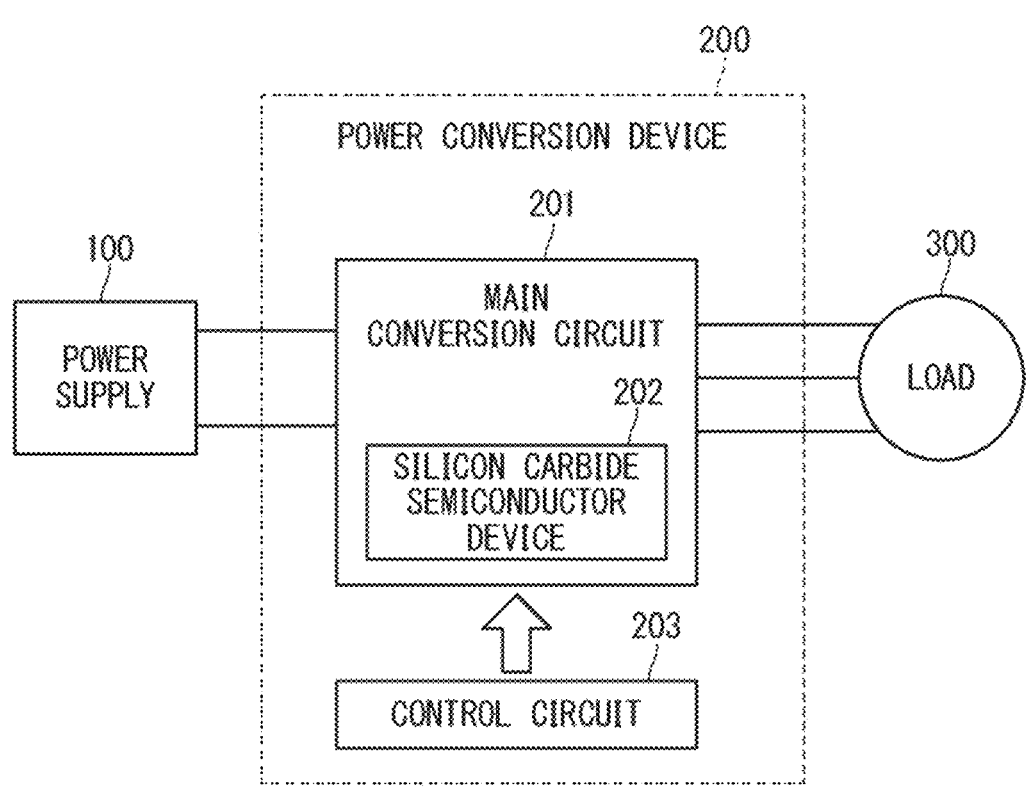

POWER SEMICONDUCTOR DEVICE WITH GATE HAVING V-GROOVE UPPER SURFACE AND METHOD OF MANUFACTURING THEREOF

TECHNICAL FIELD

The present disclosure relates to a power semiconductor device.

BACKGROUND ART

A semiconductor device using a silicon carbide (SiC) substrate (hereinafter referred to as "SiC semiconductor device") excels in breakdown voltage and heat resistance more than those of a semiconductor device using a silicon (Si) substrate (hereinafter referred to as "Si semiconductor device"). Conventionally, a SiC semiconductor device has been applied to a power semiconductor device such as a metal-oxide-semiconductor field-effect transistor (MOS-FET) or an insulated gate bipolar transistor (IGBT) in order for a semiconductor device to have high breakdown voltage, to be made low loss, or to be used in high-temperature environments.

SiC has a higher dielectric breakdown electric field strength than Si; therefore, in the SiC semiconductor device, a breakdown voltage layer (drift layer) for achieving the same breakdown voltage can be made thinner than that of the Si semiconductor device. Further, in the SiC semiconductor device, the amount of impurity doping in the breakdown voltage layer can be increased as compared with the Si semiconductor device. For these reasons, the SiC semiconductor device can obtain significantly smaller ON-resistance than the Si semiconductor device. For example, the ON-resistance of a SiC-MOSFET with a breakdown voltage of 1 kV or more and 1.2 kV or less is 5 m$\Omega$cm$^2$ or less, which is less than half the value of a Si-MOSFET or a Si-IGBT with the same breakdown voltage.

In the future, it is foreseeable that most of Si-IGBTs as inverter components will be replaced with SiC semiconductor devices as manufacturing costs improve, process technology improves, and other performance improvements are obtained. Currently, the development of trench gate type SiC-MOSFETs or SiC-IGBTs is underway to reduce the loss of SiC semiconductor devices when energized.

However, the trench gate type SiC-MOSFET or SiC-IGBT has a problem that damage layers are formed on the inner walls of the trenches during etching for forming the trenches.

Patent Document 1 discloses a method of manufacturing a SiC-MOSFET in which a damage layer on an inner wall of a trench is removed. According to the manufacturing method of Patent Document 1, a deposited film is formed on the front surface of the semiconductor substrate and the inner wall of the trench, the deposited film having a thickness thicker on the front surface of the semiconductor substrate than a thickness thereof on the inner wall of the trench. Then, the portion of the deposited film covering the inner wall of the trench is removed to expose the inner wall of the trench. Next, after growing an oxide film on the inner wall of the trench, the deposited film and the oxide film are removed. According to the method, by forming of the deposited film on the surface of the semiconductor substrate, the oxide film is less likely to be formed on the front surface of the semiconductor substrate when the oxide film is grown on the inner wall of the trench. Therefore, a diffusion layer on the front surface of the semiconductor substrate can be maintained.

PRIOR ART DOCUMENTS

Patent Documents

[Patent Document 1] Japanese Patent Application Laid-Open No. 2017-126630

SUMMARY

Problem to be Solved by the Invention

The power module includes a power semiconductor device and a wire for energizing connected to the power semiconductor device. When a wire for energizing is connected to a trench gate type power semiconductor device, there has been a problem that the trench gate is broken by the stress applied from the wire to the power semiconductor device at the time of connection, causing the power module to fail in operation.

In the SiC-MOSFET manufactured by the manufacturing method of Patent Document 1, a gate electrode is uniformly formed in the trench; therefore, breaking such as displacement of a gate electrode with the SiC substrate and the like may occur when stress is applied from the surroundings. The phenomenon is particularly remarkable in stresses applied in the direction parallel to the trench gate.

The present disclosure has been made in order to solve the above-mentioned problems, and an object of the present disclosure is to provide a trench gate type power semiconductor device that does not easily break even when stress is applied.

Means to Solve the Problem

According to the present disclosure, the power semiconductor device includes a SiC substrate, a drift layer of a first conductive type, formed on the SiC substrate, a first impurity region of a second conductivity type different from the first conductive type formed in a surface layer of the drift layer, a second impurity region of the first conductivity type selectively formed in a surface layer of the first impurity region, a trench extending through the first impurity region and the second impurity region and reaching the drift layer, a gate electrode embedded in the trench and having a V-shaped groove on an upper surface thereof, and an oxide film formed on an upper surface including the groove of the gate electrode, in which a bottom of the V-shape groove is deeper than the first impurity region.

According to the present disclosure, the method of manufacturing a power semiconductor device, includes the steps of forming a drift layer of a first conductive type on a SiC substrate, forming a first impurity region of a second conductivity type different from the first conductivity type in a surface layer of the drift layer, selectively forming a second impurity region of the first conductivity type in a surface layer of the first impurity region, forming a trench extending through the first impurity region and the second impurity region and reaching the drift layer, in the trench, forming a gate electrode having a V-shaped groove on an upper surface thereof, and forming an oxide film on an upper surface including the groove of the gate electrode.

Effects of the Invention

In the power semiconductor device of the present disclosure, the volume expansion that occurs in the process of forming the oxide film on the front surface of the groove of the gate electrode, improves the joining strength between the gate electrode and the trench via the gate insulating film. As a result, the gate electrode does not easily break even when stress is applied thereto.

BRIEF DESCRIPTION OF DRAWINGS

FIG. 1 A cross-sectional view of a SiC-MOSFET of a first embodiment.

FIG. 2 A flowchart illustrating a manufacturing process of the SiC-MOSFET of the first embodiment.

FIG. 4 A cross-sectional view of the SiC-MOSFET in a process of production of the first embodiment.

FIG. 7 A cross-sectional view of the SiC-MOSFET in a process of production of the first embodiment.

FIG. 32 A block diagram illustrating a configuration a power conversion system of a fourth embodiment.

DESCRIPTION OF EMBODIMENT(S)

A. First Embodiment

<A-1. Configuration>

Figure 3:
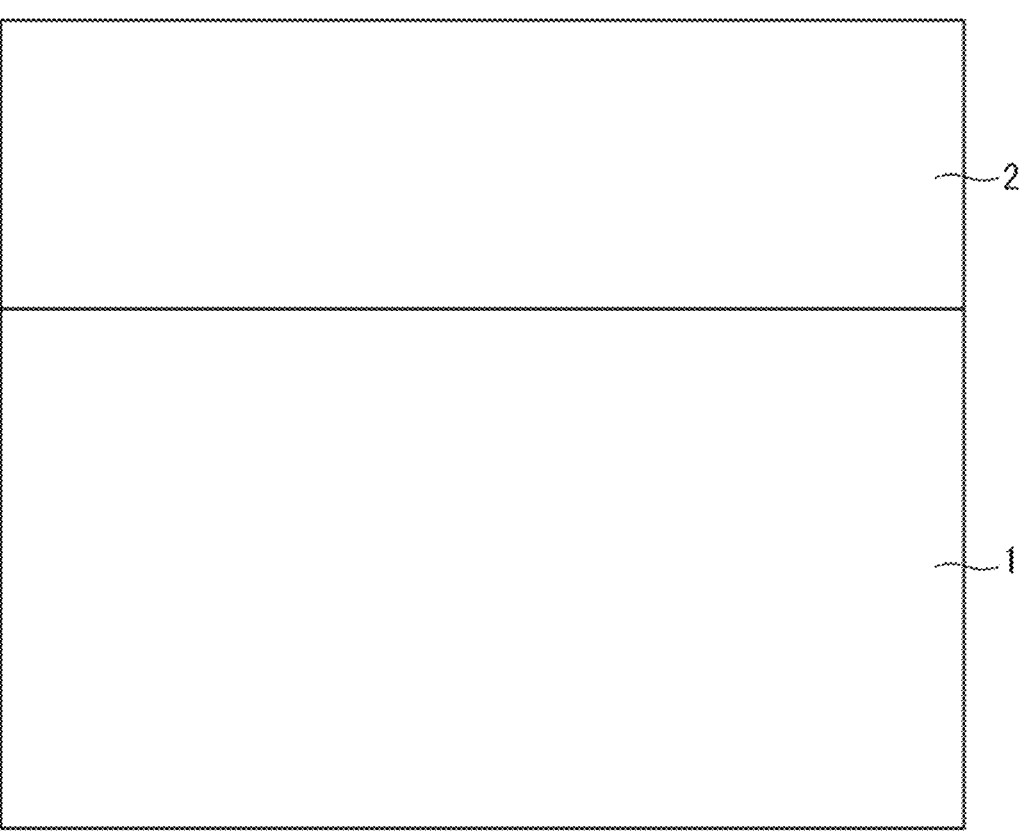
FIG. 3 A cross-sectional view of the SiC-MOSFET in a process of production of the first embodiment.

FIG. 1 is a cross-sectional view illustrating a cell structure of a main part of a SiC-MOSFET 101. The SiC-MOSFET 101 is a power semiconductor device of the first embodiment having a trench gate structure. Although FIG. 1 illustrates five cell structures, the number of cells in the SiC-MOSFET 101 is not limited thereto. In practice, the cell structures illustrated in FIG. 1 are continuous in any number in the horizontal direction in the drawing.

The SiC-MOSFET 101 includes an n-type SiC substrate 1, a drift layer 2 made of an n-type SiC, a p-type base region 3, an n-type source region 4, a p-type bottom base region 5, a gate insulating films 6, a gate electrode 7, an oxide film 8, an interlayer insulating film 9, a source electrode 10, and a drain electrode 11. In FIG. 1, a main surface on the upper side in the drawing of the SiC substrate 1 is referred to as a first main surface (hereinafter, also referred to as "front surface"), and a main surface on the lower side in the drawing is referred to as a second main surface (hereinafter, also referred to as "back surface").

The drift layer 2 is epitaxially grown on the first main surface of the SiC substrate 1. The base region 3 is selectively formed as a first impurity region in the surface layer of the drift layer 2. The source region 4 is selectively formed as a second impurity region in the surface layer of the base region 3. From the front surface of the source region 4, trenches 19 having a depth extending through the source region 4 and the base region 3 and reaching the drift layer 2 are formed. The bottom base region 5 is formed as a third impurity region in the drift layer 2 at the bottoms of the trenches 19. The gate insulating film 6 is formed on the side walls of the trenches 19. The gate electrode 7 is formed in the trenches 19. The upper surface of the gate electrode 7 is covered with the oxide film 8. The interlayer insulating film 9 is formed on the upper part of the oxide film 8 and the upper part of the source region 4. The source electrode 10 is formed on the upper parts of the base region 3, the source region 4, and the interlayer insulating film 9. The drain electrode 11 is formed on the second main surface of the SiC substrate 1.

The bottom base region 5 is not necessarily to be the one provided in contact with the bottoms of the trenches 19, and may be provided in the drift layer 2 below the bottoms of the trenches 19. Also, the bottom base region 5 is not necessarily to be the one covering the entire bottoms of the trenches 19, and may be provided so as to cover at least a part of each bottom of the trench 19. For example, the bottom base region 5 may be periodically arranged at intervals along the extending direction of the trenches 19, or may be provided so as to cover about half of the bottoms of the trenches 19 in a cross section orthogonal to the extending direction.

Alternatively, the bottom base region 5 may be configured such that the width of the bottom base region 5 may be made larger than the width of the trench 19 by covering the entire bottom so as to protrude in the width direction of the trench 19.

The bottom base region 5 is not necessarily to be the one provided along the extending direction of the trenches 19, and a plurality of bottom base regions 5 may be provided in an extending manner in a direction orthogonal to the extending direction of the trenches 19 to partially and periodically cover the bottoms of the trenches 19 in the extending direction.

The bottom base region 5 may be provided between the adjacent trenches 19 in the drift layer 2 in parallel with the extending direction of the trenches 19. In this case, the bottom base region 5 is not necessarily to be the one being provided linearly and continuously, and may be provided periodically at intervals in the extending direction of the trenches 19. The forming position of the bottom base region 5 may be the depth from the outermost surface layer of the drift layer 2 may be the same as, shallower or deeper than the depth of the bottom of the trench 19.

<A-2. Manufacturing Process>

FIG. 2 is a flowchart illustrating a manufacturing process of the SiC-MOSFET 101. Hereinafter, the manufacturing process of the SiC-MOSFET 101 will be described according to the flow of FIG. 2. First, the n-type SiC substrate 1 is prepared (Step S1). Then, as illustrated in FIG. 3, the drift layer 2 made of n-type SiC is formed as an epitaxial film on the front surface of the SiC substrate 1.

Next, a mask (not illustrated) made of a resist or the like is formed on the drift layer 2, and p-type impurities are ion-implanted into the drift layer 2 from an opening of the mask. As a result, the p-type base region 3 is formed on the surface layer of the drift layer 2 as illustrated in FIG. 4 (Step S2). The p-type impurities are, for example, boron (B) or aluminum (Al).

Figure 5:
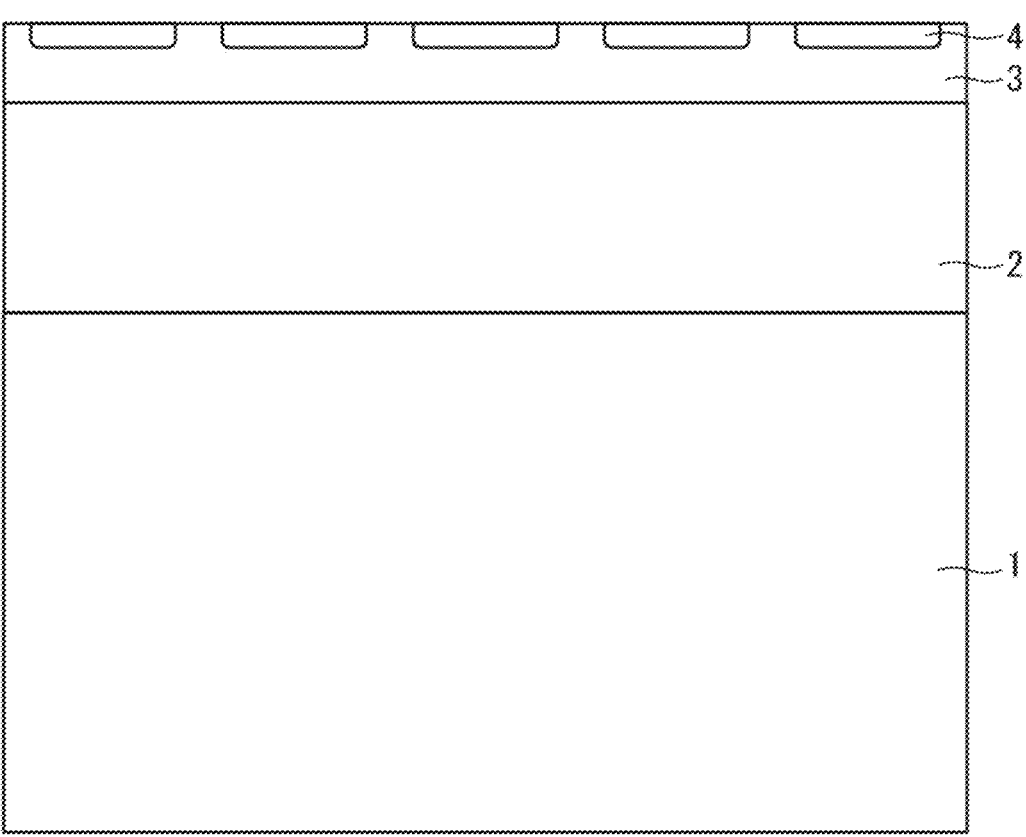
FIG. 5 A cross-sectional view of the SiC-MOSFET in a process of production of the first embodiment.

Then, a mask (not illustrated) made of a resist or the like is formed on the base region 3, and n-type impurities are ion-implanted into the base region 3 from an opening of the mask. As a result, as illustrated in FIG. 5, the n-type source region 4 is selectively formed on the surface layer of the base region 3 (Step S3). That the source region 4 is selectively formed on the surface layer of the base region 3 means that, in the surface layer of the base region 3, there are portions in which the source region 4 is formed and portions in which the source region 4 is not formed. Examples of n-type impurities include phosphorus (P) and nitrogen (N).

Next, the SiC wafer is subject to heat-treatment at a high temperature by a heat treatment device (not illustrated). As a result, the p-type impurities and n-type impurities implanted into the base region 3 and the source region 4 are electrically activated.

Figure 6:
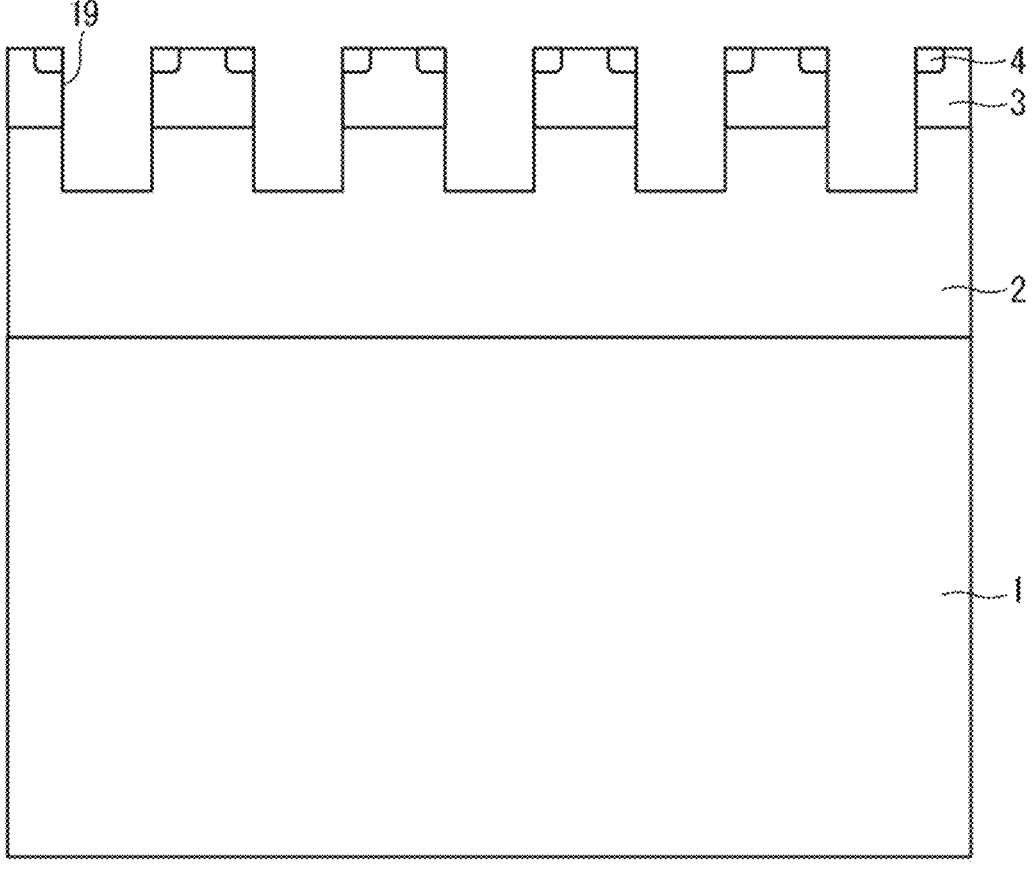
FIG. 6 A cross-sectional view of the SiC-MOSFET in a process of production of the first embodiment.

Next, a mask (not illustrated) made of a resist or the like is formed on the front surfaces of the base region 3 and the source region 4. Then, the trenches 19 are formed as illustrated in FIG. 6 by dry etching using plasma or the like (Step S4). Here, in a case where a resist mask thick enough to form the trenches 19 cannot be formed, an oxide film made of, for example, TEOS is formed on the front surfaces of the base region 3 and the source region 4, and the oxide film may be dry etched by a resist mask. Thereby, the trenches 19 with depth are formed.

Then, p-type impurities are ion-implanted into the bottom of the trenches 19. As a result, as illustrated in FIG. 7, the p-type bottom base region 5 is formed at the bottom of the trenches 19. The bottom base region 5 serves to relax the electric fields at the bottom of the trench gates. Here, the p-type impurities are, for example, boron (B) or aluminum (Al).

Next, in order to remove the plasma damage inflicted when the trenches 19 are formed, the inner walls of the trenches 19 and the surfaces of the base region 3 and the source region 4 are oxidized by a thermal oxidation method. Here, the thicker the layer to be oxidized, the more plasma damage can be removed; however, the base region 3 and the source region 4 are reduced by that amount. Therefore, the thickness of the layer to be oxidized is to be 20 nm or more and 80 nm or less, more preferably 30 nm or more and 70 nm or less. The inventor confirmed that the plasma damage on the inner walls of the trenches 19 were sufficiently removed by the above oxidation amount by measuring the leakage current between the gate electrode 7 and the source electrode 10.

Figure 8:
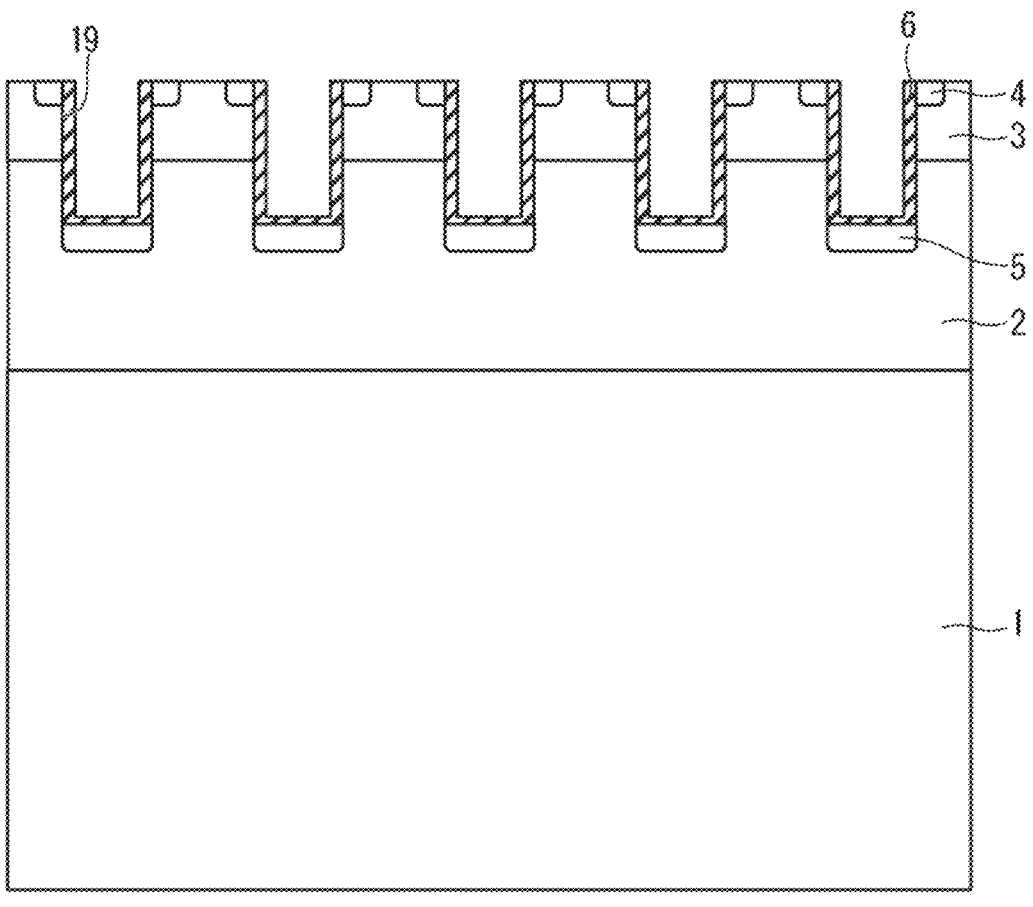
FIG. 8 A cross-sectional view of the SiC-MOSFET in a process of production of the first embodiment.

Then, as illustrated in FIG. 8, a gate insulating film 6 is formed on the inner walls of the trenches 19 by a deposition method such as chemical vapor deposition or a thermal oxidation method (Step S5). The gate insulating film 6 is formed on the side walls and the bottom surfaces of the trenches 19. The gate insulating film 6 on a bottom surface of a trench 19 has a thickness equal to or greater than that of the gate insulating film 6 on a side surface of a trench 19, and is preferably thicker by 10% or more.

Figure 9:
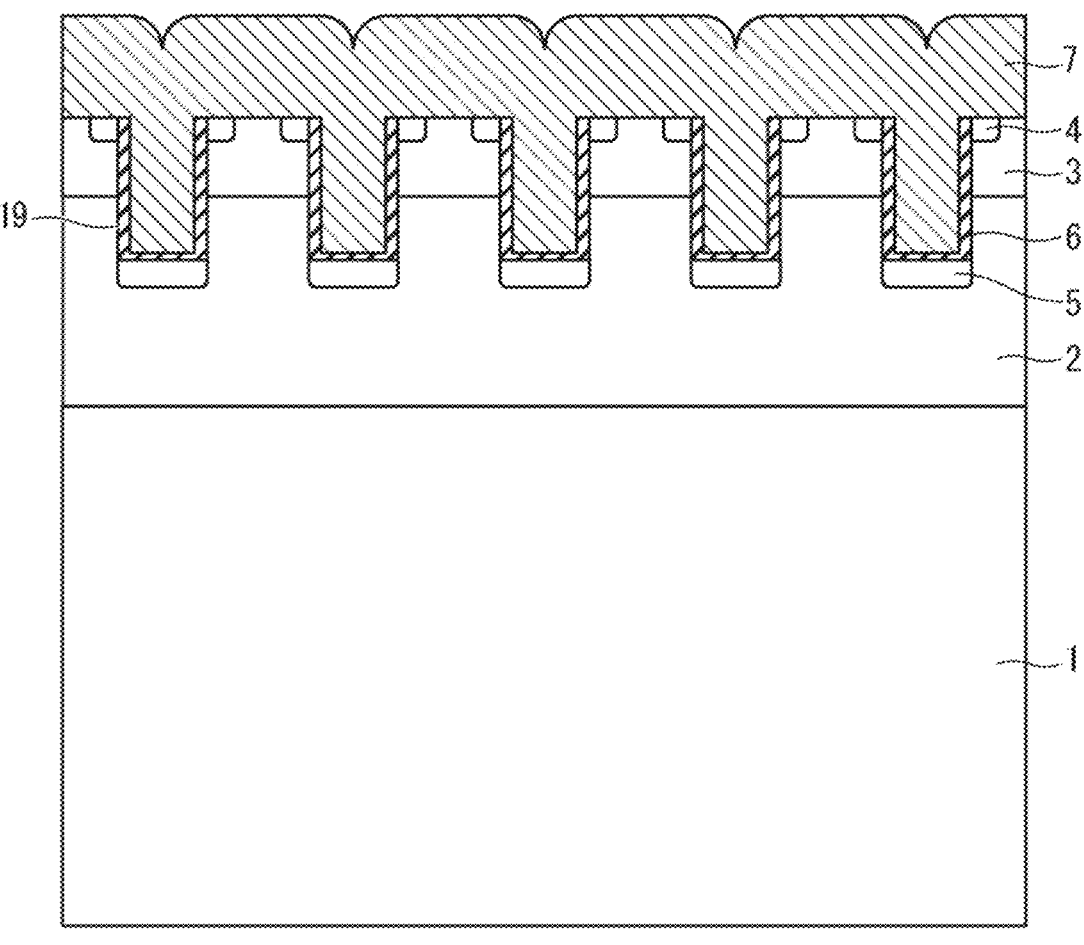
FIG. 9 A cross-sectional view of the SiC-MOSFET in a process of production of the first embodiment.
Figure 10:
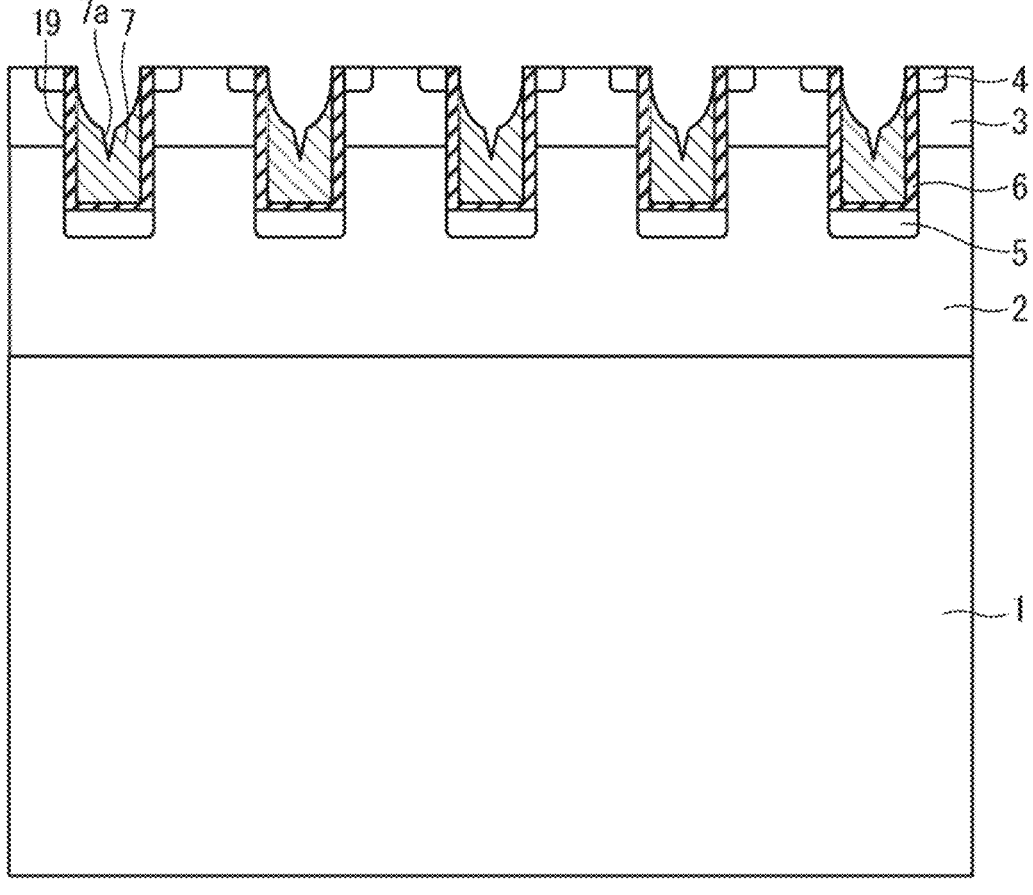
FIG. 10 A cross-sectional view of the SiC-MOSFET in a process of production of the first embodiment.

Next, as illustrated in FIG. 9, the gate electrode 7 made of polysilicon is formed on the gate insulating film 6. Then, as illustrated in FIG. 10, the excess part of the gate electrode 7 other than the inside of the trenches 19 is removed, and the gate electrode 7 is patterned (Step S6). Isotropic etching is desirably adopted for patterning the gate electrode 7. For example, in the case of dry etching, plasma etching with plasma generated using a gas containing sulfur hexafluoride (SF6) is desirable, and in the case of wet etching, etching with a mixed acid containing hydrofluoric acid and nitric acid is desirable. V-shaped grooves 7a can be formed on the upper surface of the gate electrode 7 by these etchings.

Figure 11:
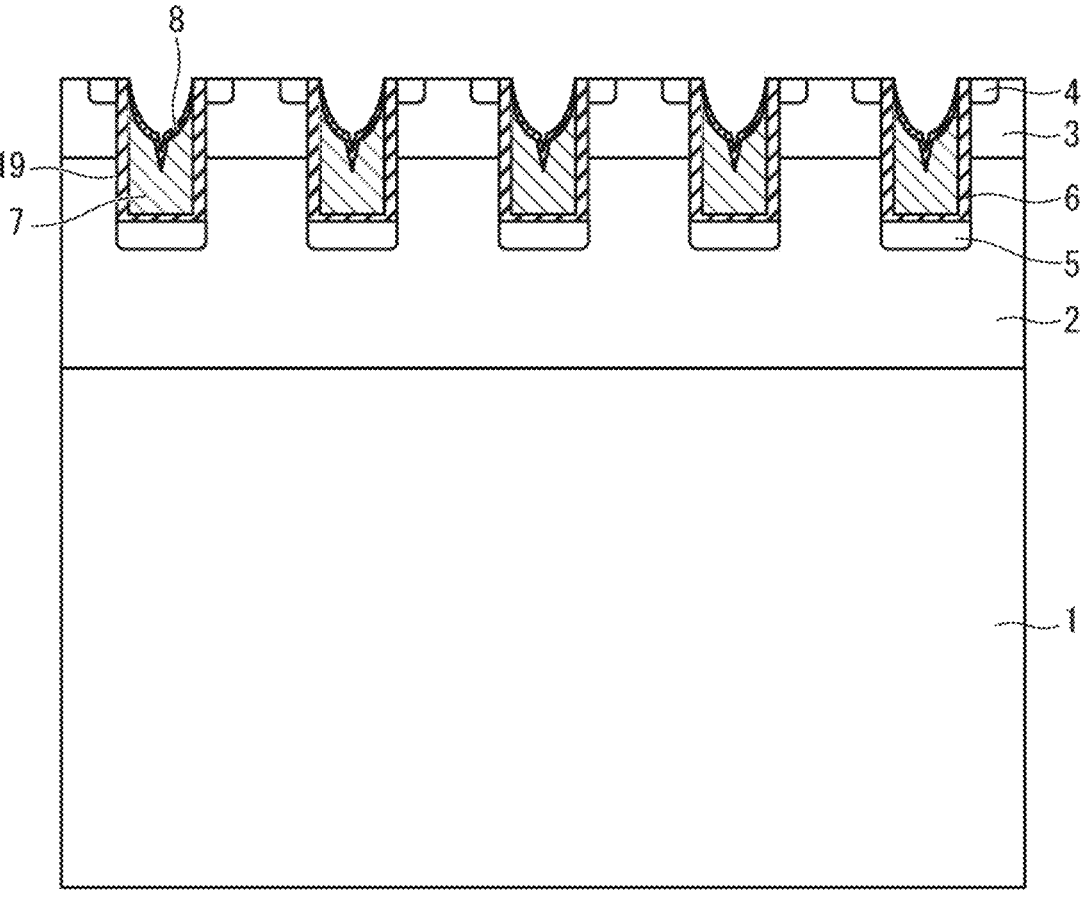
FIG. 11 A cross-sectional view of the SiC-MOSFET in a process of production of the first embodiment.

Then, as illustrated in FIG. 11, the oxide film 8 is formed on the upper surface of the gate electrode 7 including the V-shaped grooves 7a by the thermal oxidation method. The oxidation temperature at which the oxide film 8 is formed is preferably 850° C. or higher and 1050° C. or lower, and more preferably 900° C. or higher and 1000° C. or lower. The thickness of the oxide film 8 is preferably 10 nm or more and 40 nm or less, and more preferably 20 nm or more and 35 nm or less. Forming of the oxide film 8 by the thermal oxidation method causes volume expansion when the polysilicon constituting the gate electrode 7 changes to a silicon oxide film; therefore, the joining strength between the gate electrode 7 and the trench 19 via the gate insulating film 6 improves, which will be described in the details later.

Figure 12:
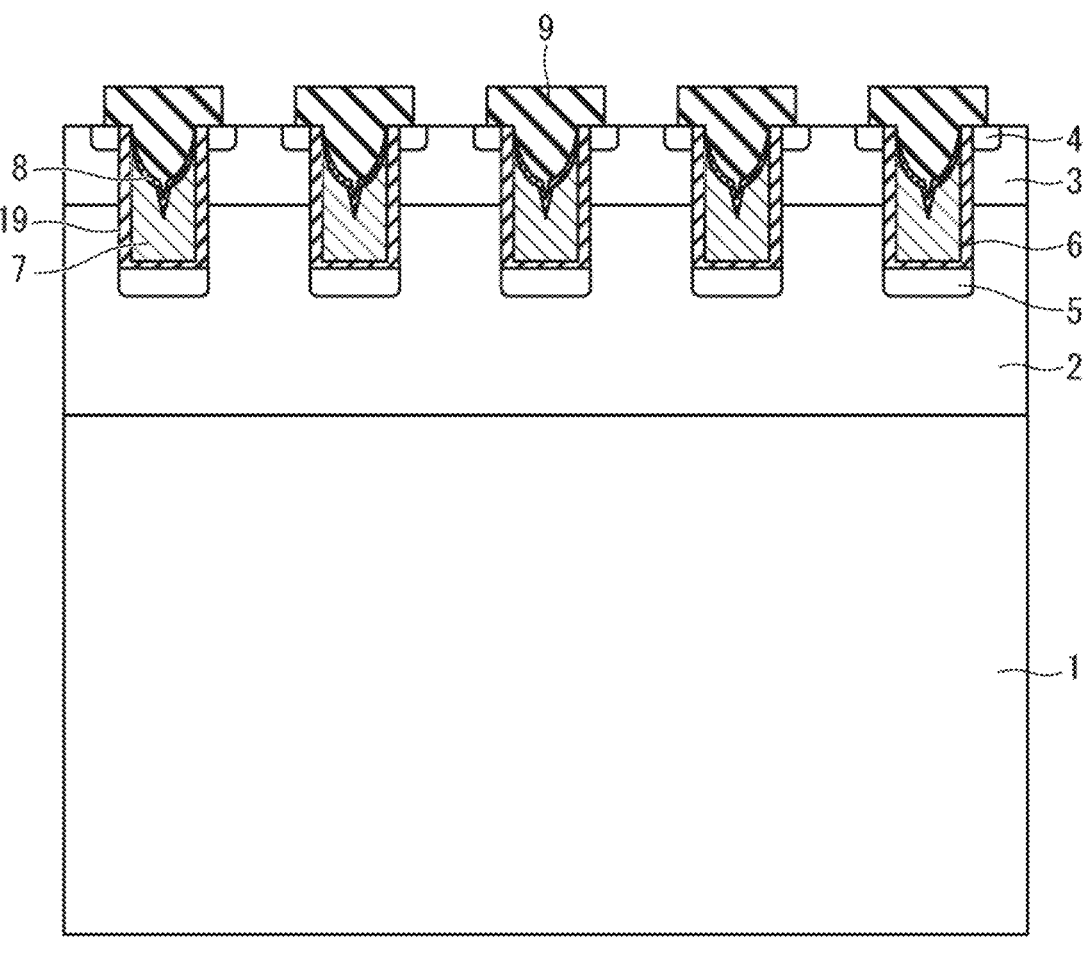
FIG. 12 A cross-sectional view of the SiC-MOSFET in a process of production of the first embodiment.

Next, the interlayer insulating film 9 is formed on the base region 3, the source region 4, and the oxide film 8 by using a chemical vapor deposition (CVD) method. Then, the interlayer insulating film 9 is patterned by the photomechanical process and etching treatment, and as illustrated in FIG. 12, the interlayer insulating film 9 is left only on the upper parts of the oxide film 8 and the source region 4 (Step S7). Introduction of impurities such as boron (B) or phosphorus (P) can make the corners of the interlayer insulating film 9 round. The material of the interlayer insulating film 9 deposited by the CVD method is, for example, silicon nitride (SixNy) or silicon oxide (SiO2). The thickness of the interlayer insulating film 9 is preferably 0.5 μm or more and 2.0 μm or less.

Figure 13:
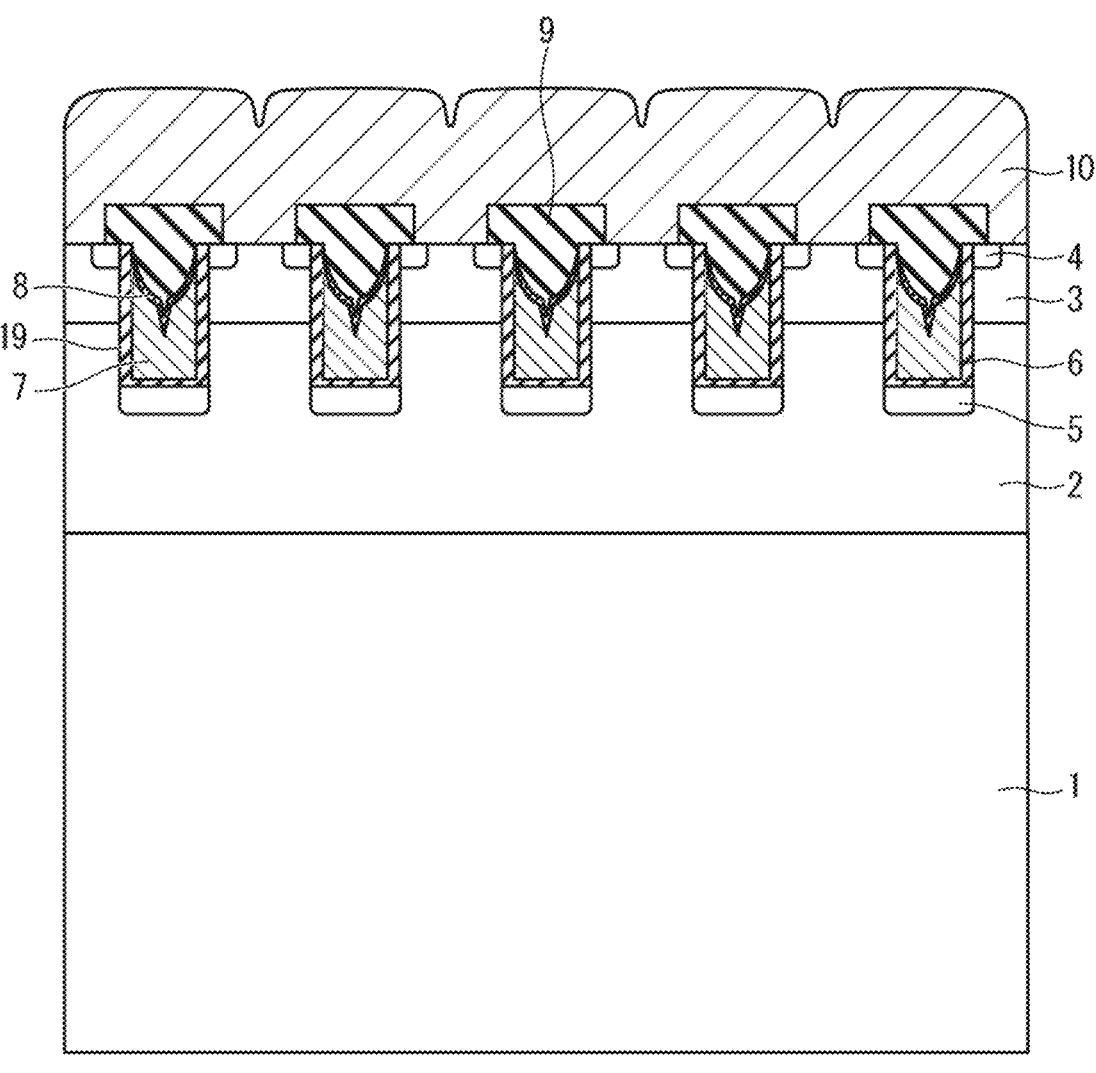
FIG. 13 A cross-sectional view of the SiC-MOSFET in a process of production of the first embodiment.

Then, as illustrated in FIG. 13, the source electrode 10 is deposited into a film (Step S8). The material of the source electrode 10 is, for example, aluminum, an aluminum alloy composed of aluminum and silicon, nickel, or the like. A barrier metal made of titanium or a titanium compound such as titanium nitride (TiN) may be appropriately formed between the base region 3 and the source region 4 and the source electrode 10.

Next, the back surface of the SiC substrate 1 is ground with a grinding wheel to thin the SiC substrate 1 if needed (Step S9).

Then, a nickel film having a thickness of about 600 nm is formed on the back surface of the SiC substrate 1 as the drain electrode 11 by a sputtering method or the like (Step S10). When the outermost surface of the nickel film is oxidized, the wettability with the solder alloy deteriorates, and the joining state of the semiconductor chip deteriorates. Therefore, a metal that is less susceptible to oxidation, such as gold or silver, can be formed on the surface of the nickel film as a protective film, and a laminated film composed of the nickel film and the protective film can be used as the drain electrode 11. Accordingly, the SiC-MOSFET 101 illustrated in FIG. 1 is completed.

<A-3. Operation>

Figure 14:
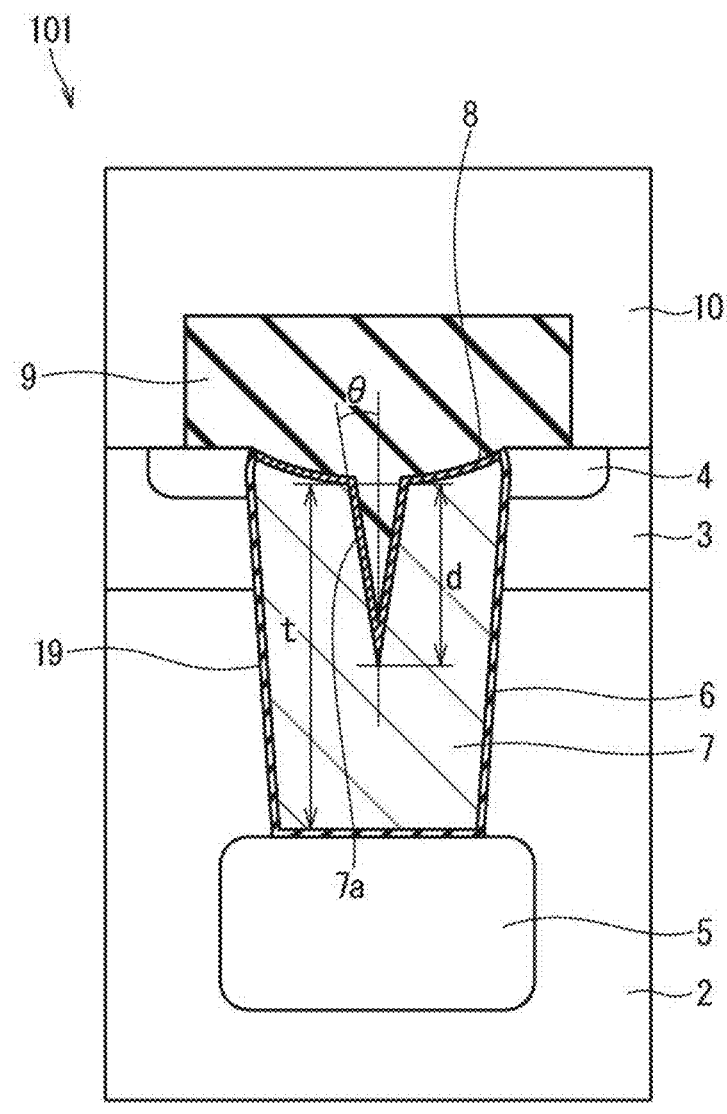
FIG. 14 An enlarged cross-sectional view of the periphery of a trench gate of the SiC-MOSFET of the first embodiment.
Figure 14:
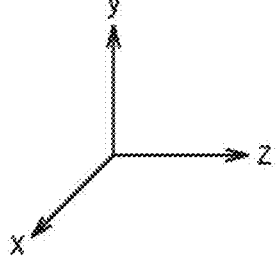

FIG. 14 is an enlarged cross-sectional view of a trench gate and the periphery of the trench gate of the SiC-MOSFET 101. In FIG. 14, the y-axis is taken in the thickness direction of the SiC-MOSFET 101, the z-axis is taken in the width direction of the trench 19, and the x-axis is taken in the direction perpendicular to the yz plane. A V-shaped groove 7a is formed on the upper surface of the gate electrode 7. The groove 7a is formed when the excess portion of the gate electrode 7 is removed by isotropic etching. θ represents the angle of the side surface of the groove 7a with respect to the thickness direction (y direction) of the SiC-MOSFET 101. Specifically, θ represents the angle at which the vertical direction (y direction) in the drawing of FIG. 14 intersects with the straight line drawn along the side surface of the groove 7a. d represents the depth of the groove 7a. Specifically, d represents the distance between a midpoint between two adjacent points to the groove 7a on the upper surface of the gate electrode 7 and the bottom of the groove 7a. t represents the depth of the gate electrodes 7. Specifically, t represents the distance between a midpoint between two adjacent points to the groove 7a on the upper surface of the gate electrode 7 and the bottom of the gate electrode 7.

By adjusting the injection energy of the n-type impurity ions when forming the source region 4, the side surface of the trench 19 in contact with the source region 4 becomes a curved shape bulging outward. The outer surface of the gate electrode 7 also has a curved shape in which the portion facing the source region 4 bulges outward along the shape of the side surface of the trench 19, that is, a protruding curved shape. In other words, the width of the portion of the gate electrode 7 facing the source region 4 increases from the upper surface of the gate electrode 7 toward the depth, and then decreases again. In other words, the side surface of the gate electrode 7 has a convex portion in a portion facing the source region 4. At this portion, an anchoring effect in the y direction is generated between the gate electrode 7 and the side surface of the trench 19. Therefore, when stress in the thickness direction (y-axis negative direction in FIG. 14) of the SiC-MOSFET 101 is applied to the gate electrode 7, the joining strength between the gate electrode 7 and the trench 19 improves significantly compared with the case where the outer surface of the gate electrode 7 is straight.

Further, the gate insulating film 6 on the side surface of the gate electrode 7 is formed thicker than the gate insulating film 6 at the bottom of the gate electrode 7. As a result, the inventor has confirmed in experiments that the amount of protrusion of the gate electrode 7 and the gate insulating film 6 into the source region 4 is increased, and the joining strength between the gate electrode 7 and the trench 19 improves.

Figure 15:
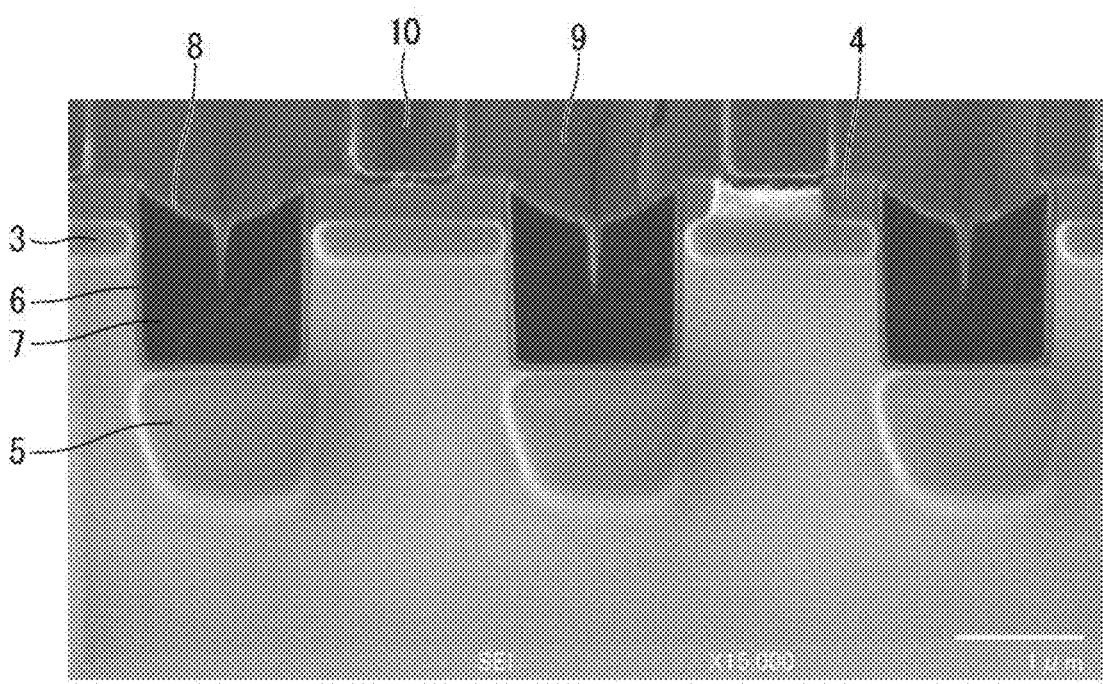
FIG. 15 A photomicrograph illustrating a cross section of the SiC-MOSFET of the first embodiment.
Figure 16:
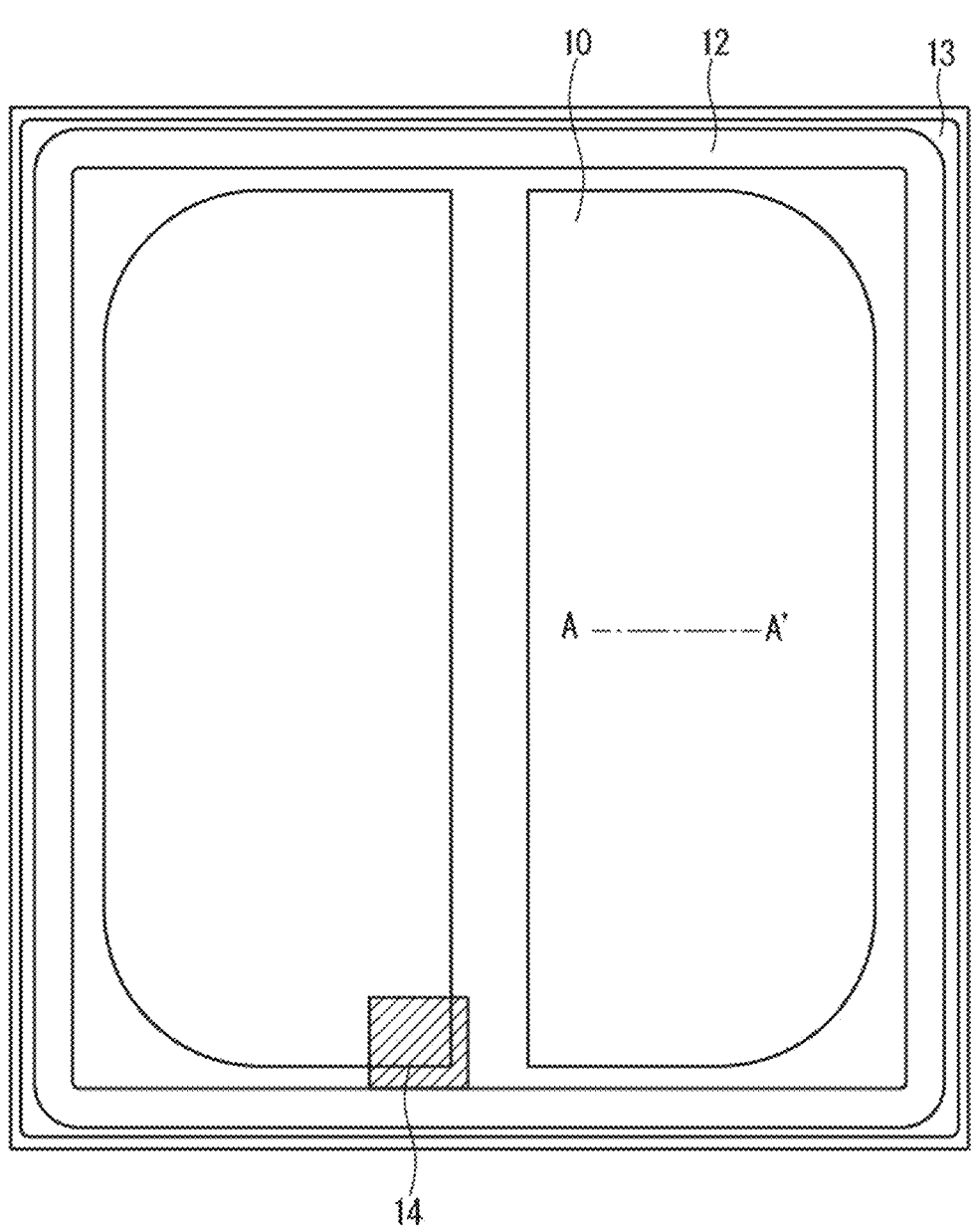
FIG. 16 A top view of the SiC-MOSFET of the first embodiment.
Figure 17:
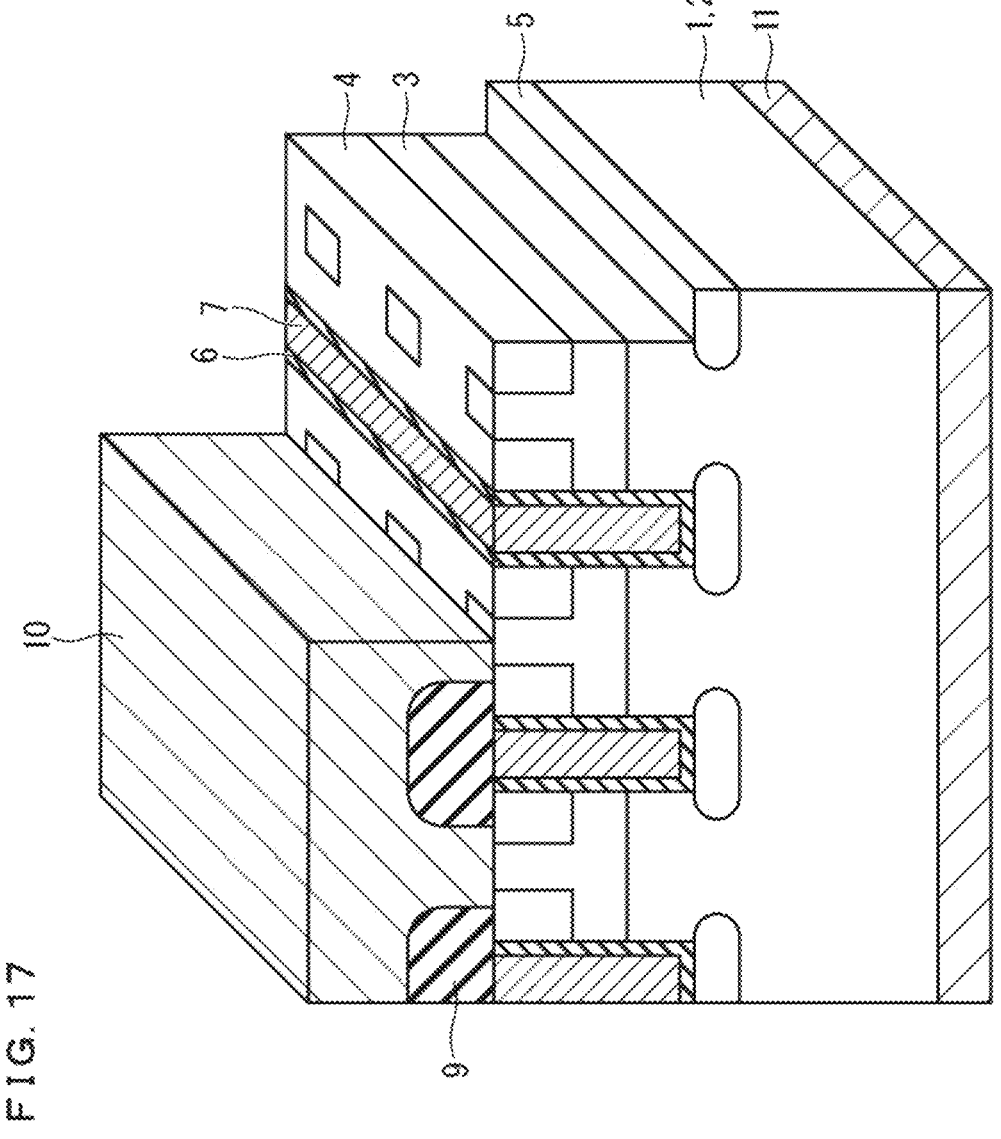
FIG. 17 A cross-sectional view taken along the line A-A' of FIG. 16.

FIG. 15 is a photomicrograph illustrating a cross section of the SiC-MOSFET 101. FIG. 16 is a top view of the SiC-MOSFET 101. FIG. 17 is a cross-sectional view taken along the line A-A' of FIG. 16. As illustrated in FIG. 16, there is a terminal region 12 outside the source electrode 10 and a terminal protective film 13 outside the terminal region 12. A part of the upper surface of the SiC-MOSFET 101 is a gate connection part 14.

Figure 18:
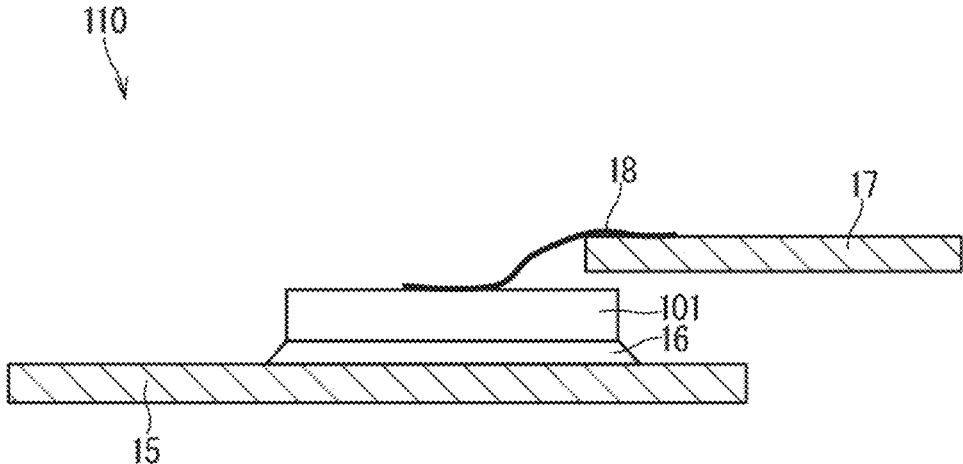
FIG. 18 A diagram illustrating a semiconductor module of the first embodiment.

FIG. 18 is a diagram illustrating a semiconductor module 110 of the first embodiment. The semiconductor module 110 includes the SiC-MOSFET 101, lead frames 15, 17, a wires 18, solder 16, and a mold resin (not illustrated). First, the lead frame 17 is connected to the front surface of the SiC-MOSFET 101 with the wire 18. Next, the lead frame 15 is connected to the back surface of the SiC-MOSFET 101 with solder 16. Then, the SiC-MOSFET 101 and the lead frames 15 and 17 are sealed with the mold resin, and the semiconductor module 110 is completed.

Figure 19:
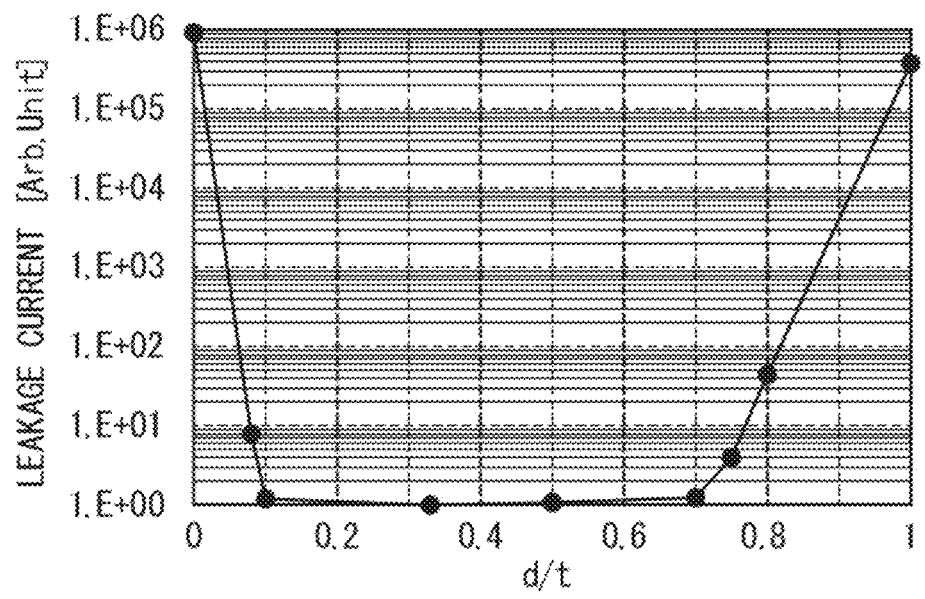
FIG. 19 A graph illustrating the relationship between the depth of a recess of the gate electrode and the leakage current.

FIG. 19 illustrates the relationship between the leakage current between the gate electrode 7 and the source electrode 10 and d/t after assembling the semiconductor module 110 when the load when connecting the wire 18 to the SiC-MOSFET 101 is intentionally increased. As described above, d represents the depth of the groove 7a of the gate electrode 7, and t represents the depth of the gate electrode 7. According to FIG. 19, the depth d of the groove 7a is preferably 10% or more and 70% or less of the depth t of the gate electrode 7. The analysis conducted by the inventor found that, when d is less than 10% of t, the stress applied when connecting the wire 18 to the SiC-MOSFET 101 moves the gate electrode 7 in the x direction in FIG. 14, breaking the SiC-MOSFET 101. The same also found that when d exceeds 70% of t, the stress applied when connecting the wire 18 to the SiC-MOSFET 101 breaks the gate electrode 7 from the groove 7a as the starting point.

As illustrated in FIG. 18, the wire 18 is bonded to the upper surface of the SiC-MOSFET 101, that is, a plane perpendicular to the depth direction (y-axis direction in FIG. 14) of the trench 19 (xz plane in FIG. 14). When the orientation of the wire 18 is not parallel to the plane (yz plane in FIG. 14) consisting of the depth direction of the trench 19 (y-axis direction in FIG. 14) and the width direction of the trench 19 (z-axis direction in FIG. 14), the force in the x-axis direction of FIG. 14 acts on the gate electrode 7 when the wire 18 is connected: therefore, the effect of the characteristic trench gate structure of the SiC-MOSFET 101 can be obtained. In particular, when the angle between the wire 18 and the trench 19 in the depth direction is 60 degrees or less, the effect of the characteristic trench gate structure of the SiC-MOSFET 101 can be remarkably obtained.

Figure 20:
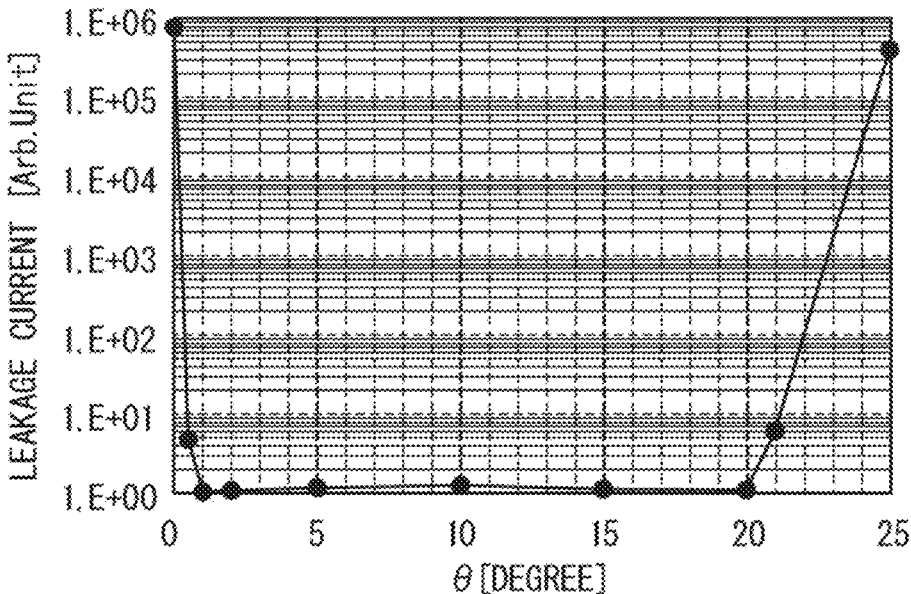
FIG. 20 A graph illustrating the relationship between the angle of a recess of the gate electrode and the leakage current.

FIG. 20 illustrates the relationship between the leakage current between the gate electrode 7 and the source electrode 10 after assembling the semiconductor module 110 and θ. As described above, θ represents the angle of the side surface of the groove 7a with respect to the thickness direction (y direction) of the SiC-MOSFET 101. According to FIG. 20, it is desirable that θ is 1 degree or more and 20 degrees or less. According to the inventor's analysis, it has been confirmed that when θ is less than 1 degree, the stress when connecting the wire 18 to the SiC-MOSFET 101 causes a crack in the gate electrode 7 that grows from the groove 7a, as the starting point, toward the lower part in the drawing of FIG. 14 and the SiC-MOSFET 101 was broken. It was also found that when θ exceeds 20 degrees, the gate electrode 7 moves in the x direction in FIG. 14 due to the stress when connecting the wire 18 to the SiC-MOSFET 101, resulting in breakage.

<A-4. Effect>

In the above, the conductive type of each semiconductor layer of the SiC-MOSFET 101 is clearly specified as n type or p type. However, the conductive type of each semiconductor layer may be inverted. That is, in the above, although the conductive type of the SiC substrate 1, the drift layer 2, and the source region 4 was n-type, and the conductive type of the base region 3 and the bottom base region 5 was p-type, conductive types may be reversed.

As described above, the SiC-MOSFET 101 of the first embodiment includes the SiC substrate 1, the drift layer 2 of the first conductive type, formed on the SiC substrate 1, the base region 3, which is a first impurity region of the second conductive type different from the first conductive type, formed in the surface layer of the drift layer, the source region 4, which is a second impurity region of the first conductive type, formed in the surface layer of the first impurity region, the trench 19 extending through the first impurity region and a plurality of second impurity regions and reaching the drift layer 2, the gate electrode 7 embedded in the trench 19 and having a V-shaped groove 7a on the upper surface thereof, and the oxide film 8 formed on the upper surface including the groove 7a of the gate electrode 7. Therefore, the volume expansion that occurs in the process of forming the oxide film 8 on the front surface of the groove 7a of the gate electrode 7, improves the joining strength between the gate electrode 7 and the trench 19 via the gate insulating film 6. As a result, the gate electrode 7 does not easily break even when stress is applied thereto.

A method of manufacturing the power semiconductor device of the first embodiment includes forming the drift layer 2 of the first conductive type, formed on the SiC substrate 1, forming the base region 3, which is the first impurity region of the second conductive type different from the first conductive type, formed in the surface layer of the drift layer 2, forming the source region 4, which is the second impurity region of the first conductive type, formed in the surface layer of the first impurity region, forming the trench 19 extending through the first impurity region and the second impurity regions and reaching the drift layer 2, forming the gate electrode 7 embedded in the trench 19 and having the V-shaped groove 7a on the upper surface thereof, and forming the oxide film 8 formed on the upper surface including the groove 7a of the gate electrode 7. The volume expansion that occurs in the process of forming the oxide film 8 on the front surface of the groove 7a of the gate electrode 7, improves the joining strength between the gate electrode 7 and the trench 19 via the gate insulating film 6. As a result, the gate electrode 7 does not easily break even when stress is applied thereto.

B. Second Embodiment

<B-1. Configuration>

Figure 21:
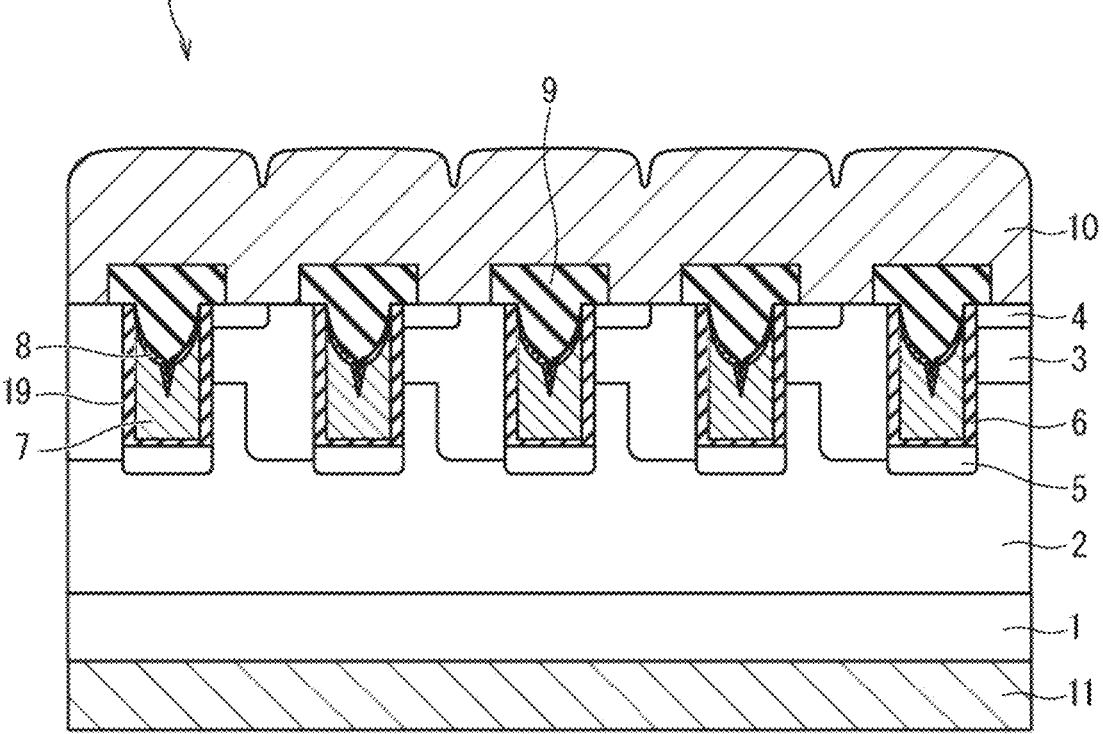
FIG. 21 A cross-sectional view of a SiC-MOSFET of a second embodiment.

FIG. 21 is a cross-sectional view illustrating a cell structure of a main part of a SiC-MOSFET 102. The SiC-MOSFET 102 is a power semiconductor device of a second embodiment having a trench gate structure. Although FIG. 21 illustrates five cell structures, the number of cells in the SiC-MOSFET 102 is not limited thereto. In practice, the cell structures illustrated in FIG. 21 are continuous in any number in the horizontal direction in the drawing.

In the SiC-MOSFET 102, the depth of the base region 3 is not constant, and a shallow portion and a deep portion are formed between two adjacent gate electrodes 7. The shallow part of the base region 3 is also referred to as a first region, and the deep portion is also referred to as a second region. That is, the base region 3 has the first region and the second region deeper than the first region. And, the source region 4 overlaps the entire first region and a part of the second region, in plan view. As illustrated in FIG. 21, the second region of the base region 3 is in contact with the bottom base region 5. Except for the depth of the base region 3, the SiC-MOSFET 102 is similar to the SiC-MOSFET 101.

<B-2. Manufacturing Process>

The manufacturing process of the SiC-MOSFET 102 is as illustrated in FIG. 2. The forming step of the base region 3 (Step S2) and the forming step of the source region 4 (Step S3) are different from those of the first embodiment, they will be described below.

Figure 22:
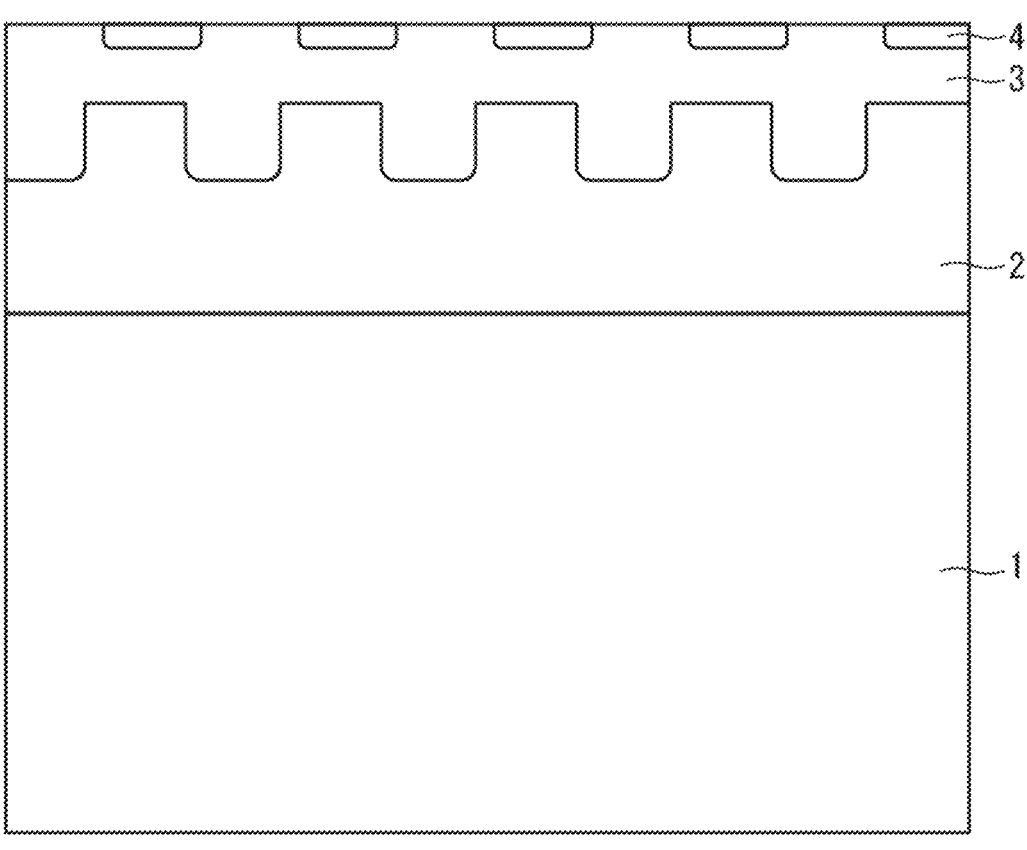
FIG. 22 A cross-sectional view of the SiC-MOSFET in a process of production of the second embodiment.

By forming a mask (not illustrated) made of resist or the like on the drift layer 2 and ion-injecting p-type impurities into the drift layer 2 from the opening of the mask, the p-type base region 3 is formed on the surface layer of the drift layer 2. (Step S2). Here, as illustrated in FIG. 22, the two types, the shallow base region 3 and the deep base region 3, are formed.

Then, a mask (not illustrated) made of a resist or the like is formed on the base region 3, and the n-type impurities are ion-implanted into the base region 3 from the opening of the mask to form the n-type source region 4 is selectively formed in the surface layer of the base region 3 (Step S3). Here, the source region 4 overlaps the entire shallow region of the base region 3 and a part of the deep region in plan view. By forming the source region 4 over a wide area so as to overlap the deep region of the base region 3 as well, the implantation amount of electrons increases and the on-resistance decreases.

Figure 23:
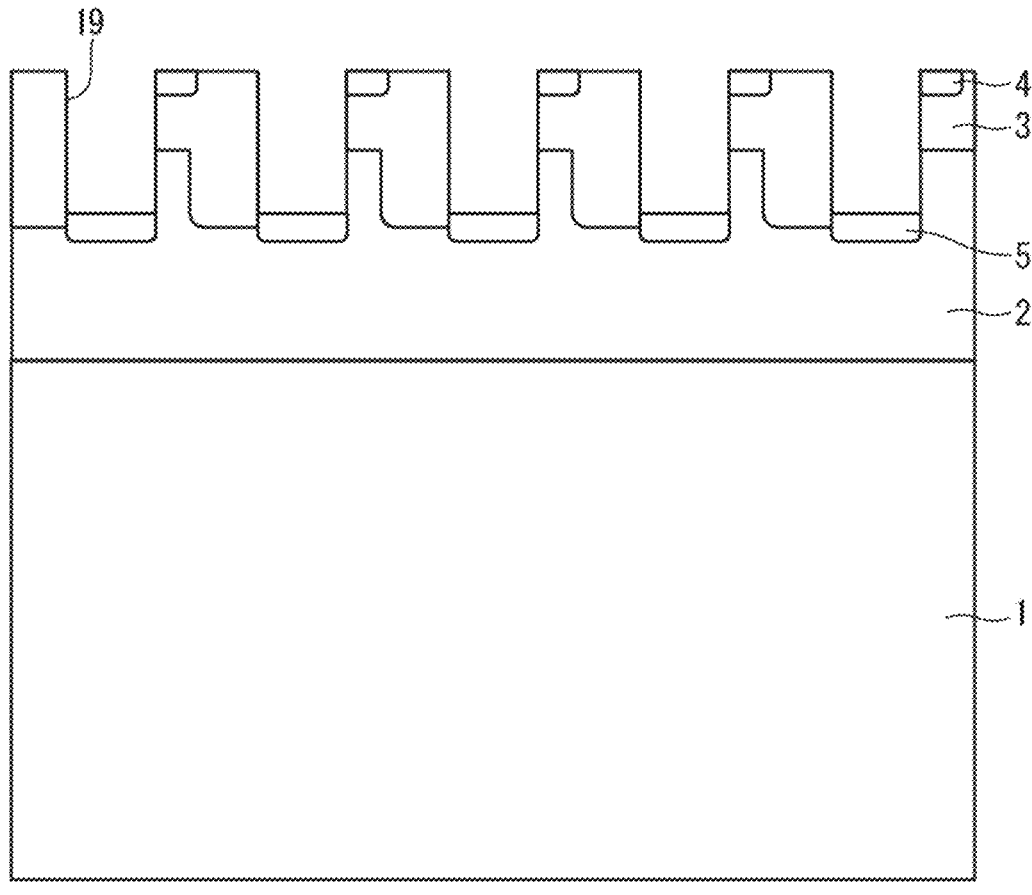
FIG. 23 A cross-sectional view of the SiC-MOSFET in a process of production of the second embodiment.

Then, as in the first embodiment, the base region 3 and the source region 4 are activated, the trenches 19 are formed, and the bottom base region 5 is formed at the bottoms of the trenches 19 as illustrated in FIG. 23. Then, the gate insulating film 6, the gate electrode 7, the interlayer insulating film 9, the source electrode 10 and the drain electrode 11 are formed in the same manner as in the first embodiment, and the SiC-MOSFET 102 illustrated in FIG. 21 is completed.

<B-3. Effect>

Figure 24:
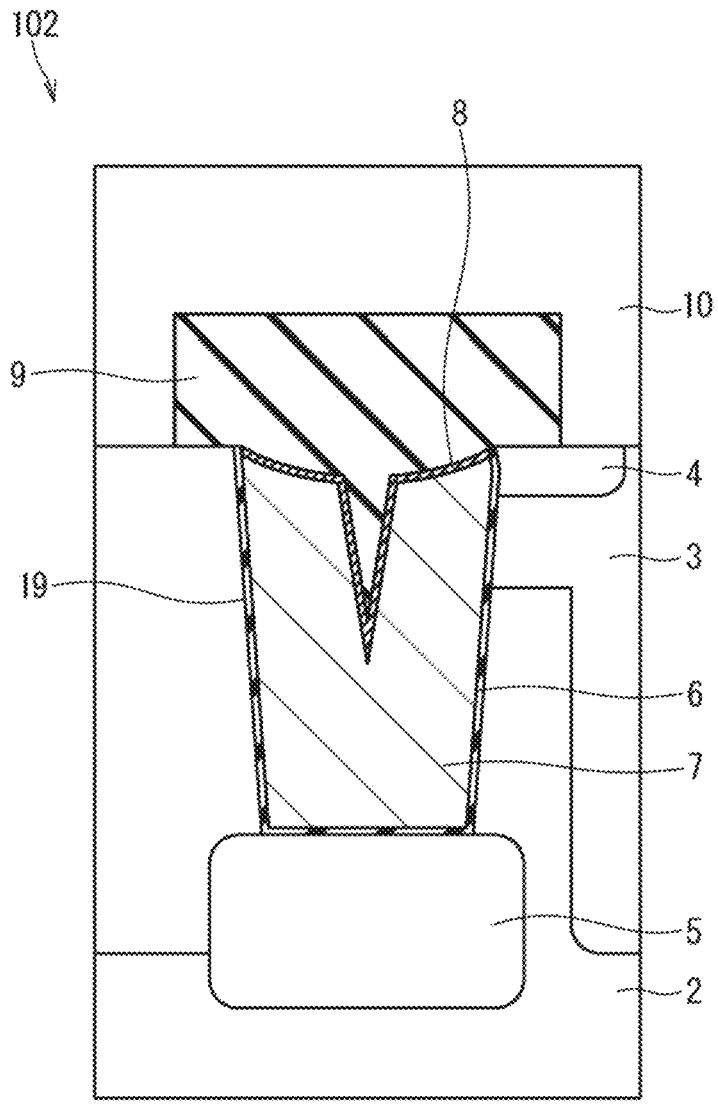
FIG. 24 An enlarged cross-sectional view of the periphery of a trench gate of the SiC-MOSFET of the second embodiment.
Figure 24:
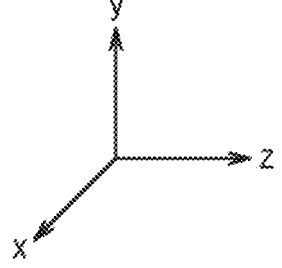

FIG. 24 is an enlarged cross-sectional view of a trench gate and the periphery of the trench gate of the SiC-MOSFET 102. According to the trench gate structure of SiC-MOSFET 102, the following effects can be obtained in addition to the effect of the trench gate structure of SiC-MOSFET 101.

In the SiC-MOSFET 102 of the second embodiment, the base region 3, which is the first impurity region, has the first region and the second region deeper than the first region. And, the source region 4, which is the second impurity region, overlaps the entire first region and a part of the second region, in plan view. In this manner, by forming the source region 4 over a wide area so as to overlap the deep region of the base region 3 as well, in the SiC-MOSFET 102, the implantation amount of electrons increases and the on-resistance decreases.

Further, in the SiC-MOSFET 102, the second region of the base region 3 is in contact with the bottom base region 5, which is the third impurity region, on the left side of the gate electrode 7. As a result, the source electrode 10 and the p-type bottom base region 5 are electrically connected through the p-type base region 3. Therefore, even when a high electric field is applied to the bottom base region 5 by switching or the like, the ON/OFF operation of the SiC-MOSFET 102 can be ensured.

C. Third Embodiment

<C-1. Configuration>

Figure 25:
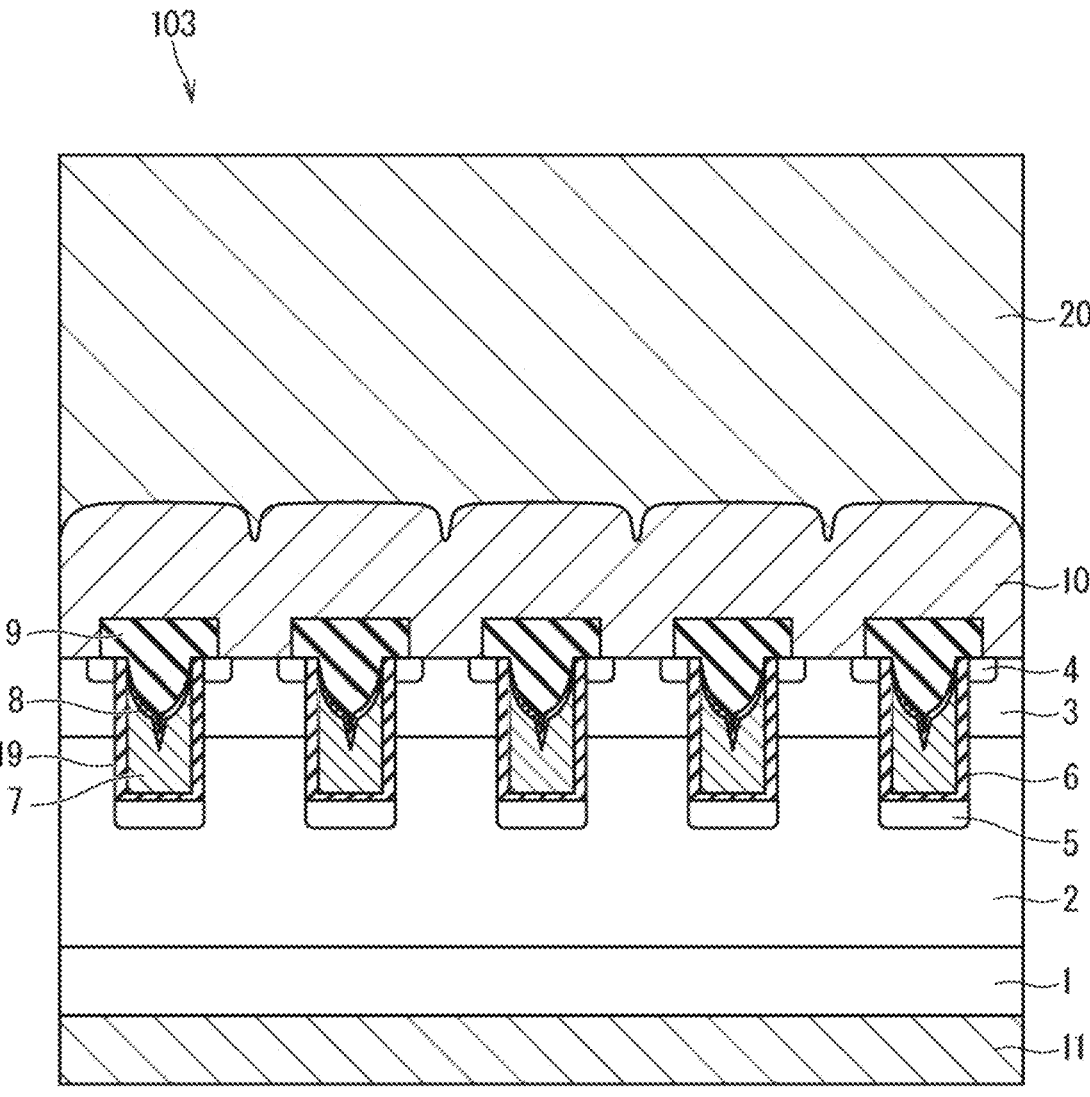
FIG. 25 A cross-sectional view of a SiC-MOSFET of a third embodiment.

FIG. 25 is a cross-sectional view illustrating a cell structure of a main part of a SiC-MOSFET 103. The SiC-MOSFET 103 is a power semiconductor device of a third embodiment having a trench gate structure. Although FIG. 25 illustrates five cell structures, the number of cells in the SiC-MOSFET 103 is not limited thereto. In practice, the cell structures illustrated in FIG. 25 are continuous in any number in the horizontal direction in the drawing.

The SiC-MOSFET 103 illustrated in FIG. 25 includes a source electrode 20 in addition to the configuration of the SiC-MOSFET 101 illustrated in FIG. 1. However, the SiC-MOSFET 103 may also include the source electrode 20 in addition to the configuration of the SiC-MOSFET 102 illustrated in FIG. 21. The source electrode 20 is formed on the source electrode 10. To distinguish between the two, the source electrode 10 is also referred to as a first source electrode, and the source electrode 20 is also referred to as a second source electrode.

<C-2. Manufacturing Process>

Figure 26:
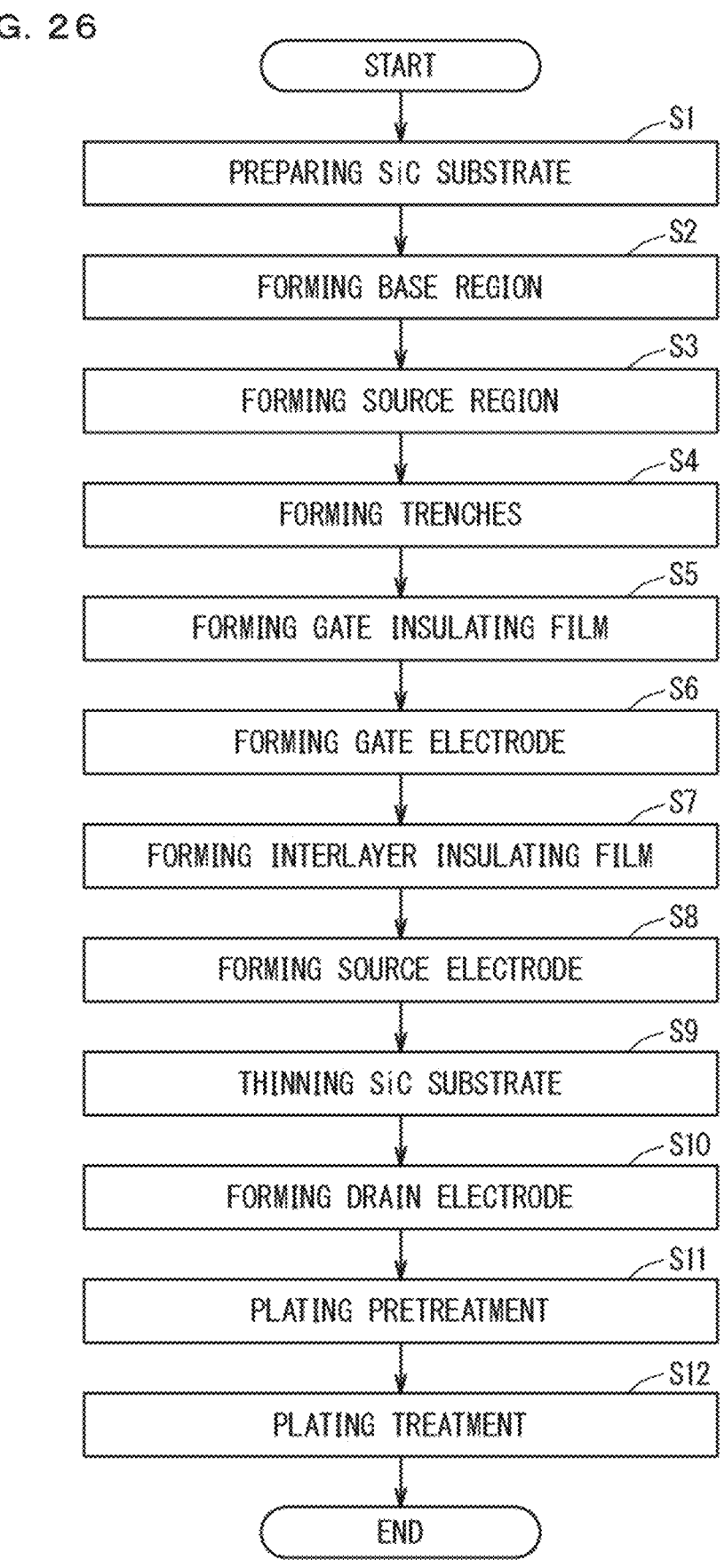
FIG. 26 A flowchart illustrating a manufacturing process of the SiC-MOSFET of the third embodiment.

FIG. 26 is a flowchart illustrating a manufacturing process of the SiC-MOSFET 103. In the manufacturing process of SiC-MOSFET 103, plating pretreatment (Step S11) and plating treatment (Step S12) are added to the manufacturing process of SiC-MOSFET 101 illustrated in FIG. 2.

Figure 27:
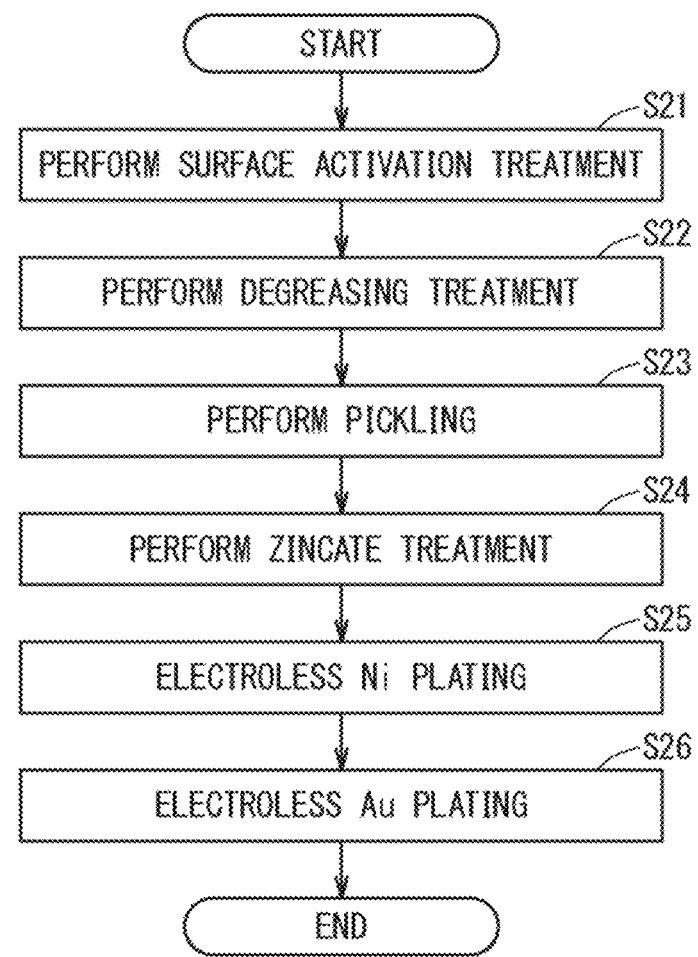
FIG. 27 A illustrating a plating treatment and a plating pretreatment in a manufacturing process of the SiC-MOS-FET of the third embodiment.

FIG. 27 is a flowchart illustrating Step S11 and Step S12 illustrated in FIG. 26 in more detail. Step S11 in FIG. 26 corresponds to Steps S21 to S24 in FIG. 27, and Step S12 in FIG. 26 corresponds to Steps S25 and S26 in FIG. 27.

When the source electrode 10 is made of an aluminum alloy, even after performing the generally known degreasing and pickling, strong organic residues and an oxide film still remain on the upper surface of the aluminum alloy. Therefore, even if the plating treatment is performed after that, metal diffusion does not sufficiently occur between the aluminum alloy and the plated metal, and forming of a plating layer having a strong adhesive force is not ensured. Therefore, in Step S11, the upper surface of the source electrode 10 is subjected to the plating pretreatment before the plating treatment.

The plating pretreatment is as follows. First, the surface activation treatment is performed in Step S21. The surface activation treatment is executed using, for example, plasma. In particular, plasma cleaning allows cleaning the upper surface of the source electrode 10 by oxidatively decomposing, with plasma, organic residues that are burnt onto the upper surface of the source electrode 10 and cannot be removed by general plating pretreatment, or by knocking them out with plasma.

Next, the degreasing treatment is performed in Step S22. The degreasing treatment is performed to remove mild organic contamination or an oxide film remaining on the upper surface of the source electrode 10.

Then, pickling is performed in Step S23. Pickling neutralizes the upper surface of the source electrode 10 and roughens thereof by etching. Pickling enhances the reactivity of the treatment solution in the subsequent step and improves the adhesive force of the plating film.

Next, a zincate treatment is performed in Step S24. The zincate treatment is a treatment for forming a zinc (Zn) film while removing the aluminum oxide film on the upper surface of the aluminum alloy when the source electrode 10 is made of an aluminum alloy. Specifically, when an aluminum alloy is immersed in an aqueous solution in which zinc is dissolved as ions, aluminum dissolves as ions because the standard oxidation-reduction potential of zinc is more noble than that of aluminum. The electrons generated at this point cause zinc ions to receive electrons on the upper surface of the aluminum alloy, forming a zinc film on the upper surface of the aluminum alloy. At this point, the aluminum oxide film is removed.

The zincate treatment may be performed a plurality of times. For example, after performing the first zincate treatment, the zincate formed by the first zincate treatment is peeled off. Then, the second zincate treatment is performed.

Steps S24 to S27 described above are the plating pretreatments. A sufficient washing time for each Step from Step S24 to Step S27 is required to be secured so that the treatment solution or residues from the previous Step is not brought into the following Step.

Then, in Step S12, the plating treatment, which is a wet film forming method, is performed. Specifically, first, electroless Ni plating is formed in Step S25. When an aluminum alloy with a zinc film formed thereon is immersed in an electroless Ni plating solution, first, the standard oxidation-reduction potential of zinc is baser than that of aluminum; therefore, nickel is deposited on the upper surface of the aluminum alloy.

Subsequently, when the upper surface of the aluminum alloy is covered with nickel, nickel is autocatalytically deposited by the action of the reducing agent contained in the electroless Ni plating solution. However, at the time of this autocatalytic deposition, the component of the reducing agent is incorporated into the electroless Ni plating film, so that the electroless Ni plating film becomes an alloy. Further, when the concentration of the reducing agent is high, the electroless Ni plating film to be formed becomes amorphous. Further, hypophosphite is used in general as a reducing agent, phosphorus (P) is contained in the electroless Ni plating.

Under such conditions, an electroless Ni-plated film having a thickness of 5 $\mu$m is formed on the upper surface of the source electrode 10.

Next, electroless Au plating is formed in Step S26. The substitution type electroless Au plating is a type of plating in which electroless Au plating is formed on the upper surface of the electroless Ni plating, and the action where nickel replaces Au by the action of a complexing agent contained in the plating solution is used.

The electroless Au plating is a substitution type: therefore, the reaction is halted when the surface of nickel is covered with Au. Therefore, forming of a thick electroless Au plating is a difficult task. The thickness of electroless Au plating is 0.1 $\mu$m at best, and typically, it is about 0.05 $\mu$m in many cases. However, when used for soldering, the thickness of Au plating having the above-mentioned thickness value is not too thin. The film made of the electroless Ni plating and the electroless Au plating thus formed is the source electrode 20.

Figure 28:
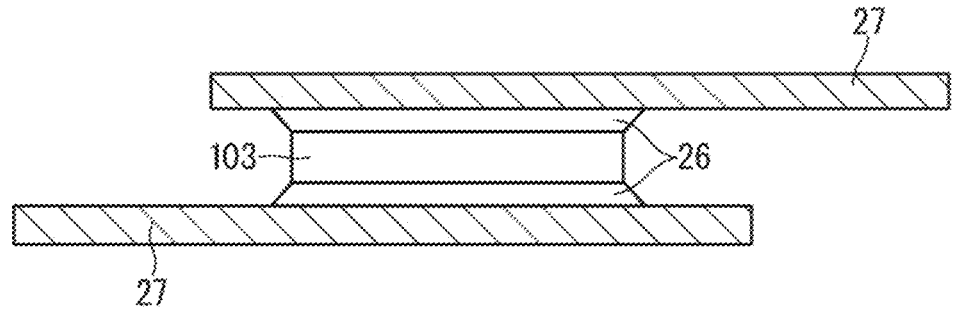
FIG. 28 A cross-sectional view illustrating a semiconductor module in a process of production of the third embodiment.
Figure 29:
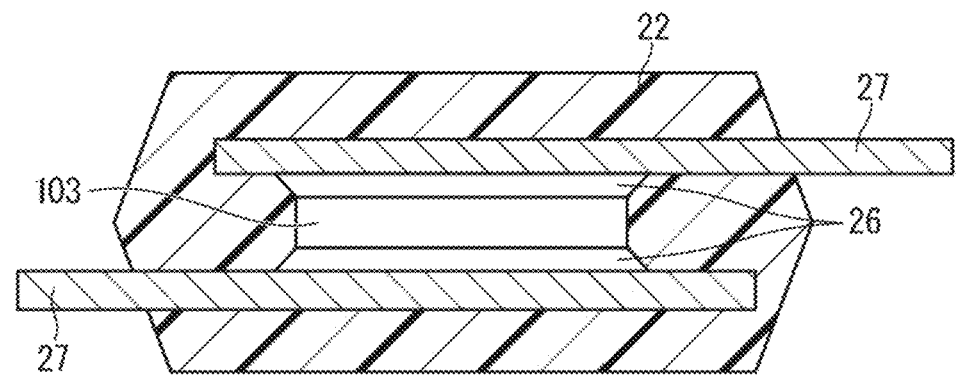
FIG. 29 A cross-sectional view illustrating a semiconductor module of the third embodiment.

Next, a semiconductor module including the SiC-MOSFET 103 will be described. FIG. 28 is a cross-sectional view illustrating a manufacturing process of a semiconductor module. As illustrated in FIG. 28, the upper surface and the lower surface of the SiC-MOSFET 103 are connected to the lead frames 27 using solder 26, respectively. Then, as illustrated in FIG. 29, the SiC-MOSFET 103 and a part of the lead frames 27 are sealed with the mold resin 22 so that the tips of the lead frames 27 are exposed, and the semiconductor module is completed.

<C-3. Modification>

Figure 30:
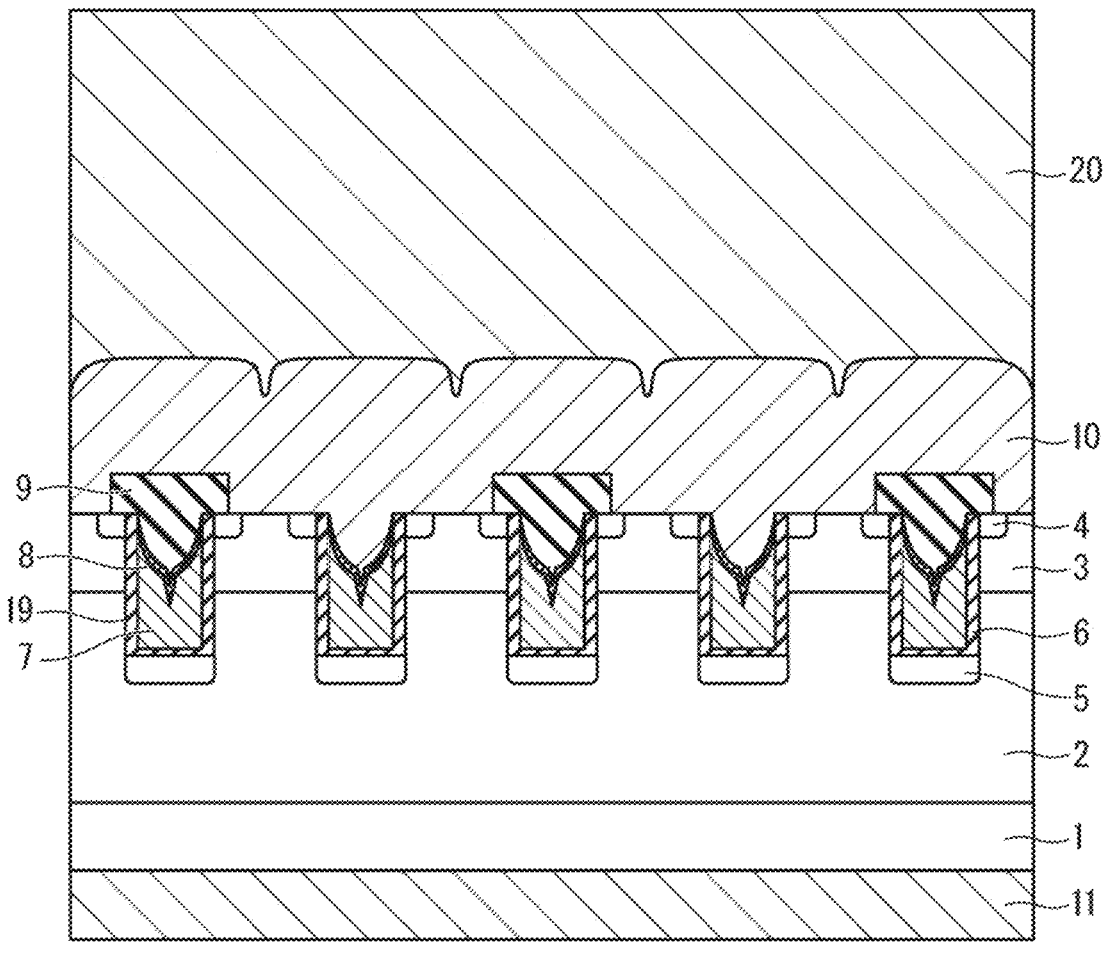
FIG. 30 A cross-sectional view of a SiC-MOSFET of a first modification of the third embodiment.

FIG. 30 is a cross-sectional view illustrating the cell structure of a main part of the SiC-MOSFET 103A, which is a power semiconductor device of a first modification of the third embodiment having the trench gate structure. Although FIG. 30 illustrates five cell structures, the number of cells in the SiC-MOSFET 103A is not limited thereto. In practice, the cell structures illustrated in FIG. 30 are continuous in any number in the horizontal direction in the drawing.

In the SiC-MOSFET 103, the interlayer insulating film 9 is formed on all the gate electrodes 7 via the oxide film 8, whereas in the SiC-MOSFET 103A, the interlayer insulating film 9 is not formed on some of the gate electrodes 7.

The SiC-MOSFET 103A is formed as follows. After forming the gate electrode 7, the interlayer insulating film 9 is formed on the base region 3, the source region 4, and the oxide film 8. Then, when patterning the interlayer insulating film 9 by photomechanical process and etching processing, as illustrated in FIG. 30, the interlayer insulating film 9 is left only on a part of the gate electrode 7 and on the source region 4 adjacent to the part of the gate electrode 7. In the SiC-MOSFET 103A, only the gate electrode 7 on which the interlayer insulating film 9 is formed is used for switching. Therefore, patterning the interlayer insulating film 9 ensures control of the energization performance of the SiC-MOSFET 103A.

Figure 31:
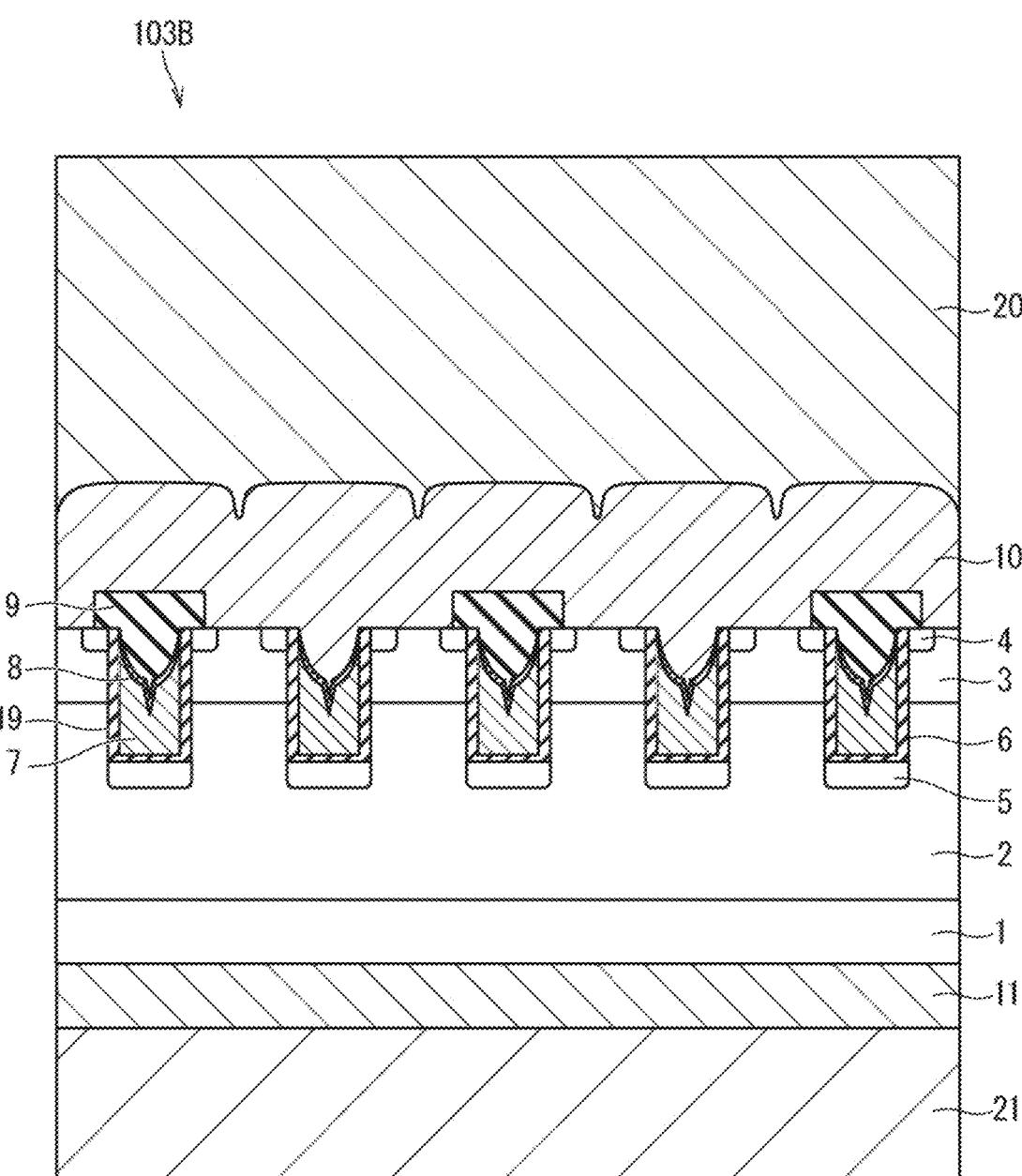
FIG. 31 A cross-sectional view of a SiC-MOSFET of a second modification of the third embodiment.

FIG. 31 is a cross-sectional view illustrating the cell structure of a main part of the SiC-MOSFET 103B, which is a power semiconductor device of a second modification of the third embodiment having the trench gate structure. Although FIG. 31 illustrates five cell structures, the number of cells in the SiC-MOSFET 103B is not limited thereto. In practice, the cell structures illustrated in FIG. 31 are continuous in any number in the horizontal direction in the drawing.

The SiC-MOSFET 103B is one in which a drain electrode 21, being a plating film, is added on the drain electrode 11 in the SiC-MOSFET 103A. To distinguish between the two, the drain electrode 11 is also referred to as a first drain electrode, and the drain electrode 21 is also referred to as a second drain electrode. The drain electrode 21 can be formed at the same time as the source electrode 20 in the manufacturing process of the SiC-MOSFET 103 described in <C-2>.

The source electrode 20 is thicker than the drain electrode 21. The thickness of the source electrode 20 is preferably 1.05 times or more the thickness of the drain electrode 21. When the temperature of the SiC-MOSFET 103 fluctuates due to intermittent energization such as switching operation, expansion and contraction of the solder and wires for joining the SiC-MOSFET 103, or the source electrodes 10 and 20 provided to the SiC-MOSFET 103 generates a force in the compression and tension directions (hereinafter referred to as "expansion/contraction stress") is generated between the SiC substrate 1 and drift layer 2 composed of SiC and the gate electrode 7 composed of polysilicon. However, by increasing the film thickness of the source electrode 20 as described above, the expansion/contraction stress acting on the front surface side becomes larger than that on the back surface side of the SiC-MOSFET 103. Therefore, the expansion/contraction stress can be received not at the bottom of the gate electrode 7 but at the upper part of the gate electrode 7 and the trench 19 where the joining strength is significantly improved.

D. Fourth Embodiment

In the fourth embodiment, the power semiconductor device of the first to third embodiments is applied to a power conversion device. Although the application of the power semiconductor device of the first to third embodiments is not limited to a specific power conversion device, hereinafter, as the fourth embodiment, a case where the power semiconductor device of the first to third embodiments is applied to a three-phase inverter will be described.

FIG. 32 is a block diagram illustrating a configuration a power conversion system to which a power conversion device of the fourth embodiment is applied.

The power conversion system illustrated in FIG. 32 includes a power supply 100, a power conversion device 200, and a load 300. The power supply 100 is a DC power supply and supplies DC power to the power conversion device 200. The power supply 100 can be configured with various components, for example, the configuration thereof may include a DC system, a solar cell, and a storage battery, or include a rectifier circuit connected to an AC system or an AC/DC converter. Further, the power supply 100 may be configured by a DC/DC converter that converts the DC power output from the DC system into a predetermined power.

The power conversion device 200 is a three-phase inverter connected between the power supply 100 and the load 300. The power conversion device 200 converts the DC power supplied from the power supply 100 into AC power, and supplies the converted AC power to the load 300. As illustrated in FIG. 32, the power conversion device 200 includes a main conversion circuit 201 and a control circuit 203. The main conversion circuit 201 converts the input DC power into AC power and outputs the AC power. The control circuit 203 outputs a control signal for controlling the main conversion circuit 201 to the main conversion circuit 201.

The load 300 is a three-phase electric motor driven by AC power supplied from the power conversion device 200. The load 300 is not limited to a specific application, and is an electric motor mounted on various electric devices. For example, the load 300 is used as an electric motor for a hybrid vehicle, an electric vehicle, a railroad vehicle, an elevator, or an air conditioning apparatus.

Hereinafter, the detailed description is made on the power conversion device 200. The main conversion circuit 201 includes a silicon carbide semiconductor device 202. The silicon carbide semiconductor device 202 includes a switching element and a freewheeling diode. By the switching element switching, the main conversion circuit 201 converts the DC power supplied from the power supply 100 into AC power, and supplies the converted AC power to the load 300. There are various specific circuit configurations of the main conversion circuit 201, and the main conversion circuit 201 of the fourth embodiment is a two-level three-phase full bridge circuit, and has six switching elements and six freewheeling diodes each of which is anti-parallel with the respective switching elements. The power semiconductor device according to any one of the above embodiments 1 to 3 is applied to the switching element constituting the silicon carbide semiconductor device 202 of the main conversion circuit 201. Each of the two switching elements connected in series of the six switching elements constitutes an upper and lower arm, and each upper and lower arm constitutes each phase (U phase, V phase, W phase) of the full bridge circuit. Then, the output terminal of each upper and lower arm, that is, the three output terminals of the main conversion circuit 201 are connected to the load 300.

Further, the main conversion circuit 201 includes a drive circuit (not illustrated) for driving each switching element. The drive circuit generates a drive signal for driving the switching element of the main conversion circuit 201 and supplies the drive signal to the control electrode of the switching element of the main conversion circuit 201. Specifically, in response to the control signal from the control circuit 203 described later, a drive signal for turning ON the switching element and a drive signal for turning OFF the switching element are output to the control electrode of each switching element. When the switching element is kept in the ON state, the drive signal is a voltage signal (ON signal) equal to or higher than a threshold voltage of the switching element, and when the switching element is kept in the OFF state, the drive signal is a voltage signal (OFF signal) equal to or lower than the threshold voltage of the switching element.

The control circuit 203 controls the switching elements of the main conversion circuit 201 so that the desired power is supplied to the load 300. Specifically, the control circuit 203 calculates the time (ON time) for each switching element of the main conversion circuit 201 to be in the ON state based on the power to be supplied to the load 300. For example, the main conversion circuit 201 is controlled by Pulse Width Modulation (PWM) control that modulates the ON time of the switching element according to the voltage to be output. Then, the control circuit 203 outputs a control command (control signal) to the drive circuit provided in the main conversion circuit 201 so that an ON signal is output to the switching element supposed to be turned on at each time point and an OFF signal is output to the switching element supposed to be turned off. The drive circuit outputs an ON signal or an OFF signal as a drive signal to the control electrode of each switching element according to the control signal.

According to the present embodiment, the silicon carbide semiconductor device 202 described above is used as at least one of the semiconductor devices constituting the main conversion circuit 201. As a result, even if stress is applied, the occurrence of dielectric breakdown due to the displacement of the gate electrode 7 is suppressed. This enhances, not only the reliability of the main conversion circuit 201 and, but the reliability of the power conversion device 200.

Although in the present embodiment, the present disclosure is applied to the two-level three-phase inverter has been described, the present disclosure is not limited there to, and can be applied to various power conversion apparatuses. In the present embodiment, although the power conversion device is a two-level power conversion device, a multi-level power conversion device such as a three-level power conversion device may be used. Further, when supplying power to a single-phase load, the present disclosure may be applied to a single-phase inverter. Further, when supplying power to a DC load or the like, the present disclosure is adoptable to the DC/DC converter or the AC/DC converter.

Further, the power conversion device to which the present disclosure is applied is not limited to the case where the above-mentioned load is an electric motor, the power conversion apparatus can be applied to the case where a load is a power supply device for an electric discharge machine, a laser machine, an induction heating cooker, or a contactless power supply system, further applied to the case where a load is a power conditioner for a solar power generation system and a power storage systems, for example In the present disclosure, each embodiment can be arbitrarily combined, appropriately modified or omitted, without departing from the scope of the invention. The foregoing description is in all aspects illustrative and not restrictive. It is understood that numerous other modifications not having been described can be devised without departing from the scope of the invention.

EXPLANATION OF REFERENCE SIGNS

1 SiC substrate, 2 drift layer, 3 base region, 4 source region, 5 bottom base region, 6 gate insulating film, 7 gate electrode, 7a groove, 8 oxide film, 9 interlayer insulating film, 10 source electrode, 11 drain electrode, 12 terminal region, 13 terminal protective film, 14 gate connection part, 15, 17 lead frame, 16 solder, 18 wire. 19 trench. 100 power supply. 110 semiconductor module. 200 power conversion apparatus. 201 main conversion circuit. 202 silicon carbide semiconductor device. 203 control circuit. 300 load.

The invention claimed is:

1. A power semiconductor device comprising:
a SiC substrate;
a drift layer of a first conductive type, formed on the SiC substrate;
a first impurity region of a second conductivity type different from the first conductive type formed in a surface layer of the drift layer;
a second impurity region of the first conductivity type selectively formed in a surface layer of the first impurity region;
a trench extending through the first impurity region and the second impurity region and reaching the drift layer, wherein the trench has a bottom surface that is at least partially flat;
a gate electrode embedded in the trench and having a pointed end V-shaped groove on an upper surface thereof; and
an oxide film formed on an upper surface including the groove of the gate electrode, wherein
a bottom of the pointed end V-shaped groove is deeper than the first impurity region, and
an angle of a side surface of the groove of the gate electrode with respect to a thickness direction of the power semiconductor device is 1 degree or more and 20 degrees or less.

2. The power semiconductor device according to claim 1, wherein
the gate electrode is made of polysilicon, and
the oxide film is a silicon oxide film.

3. The power semiconductor device according to claim 1, wherein
a distance between a midpoint between two locations adjacent to both ends of the groove on the upper surface of the gate electrode and a bottom of the gate electrode is a height of the gate electrode, and a depth of the groove is 10% or more and 70% or less of the height of the gate electrode.

4. The power semiconductor device according to claim 1, wherein
a side surface of the gate electrode has a convex portion in a portion facing the second impurity region.

5. The power semiconductor device according to claim 4, wherein the side surface of the gate electrode includes a first side surface and a second side surface opposite to the first side surface, the first side surface of the gate electrode faces the second impurity region and has the convex portion, and the second side surface of the gate electrode is in contact with the first impurity region and does not have the convex portion.

6. The power semiconductor device according to claim 1, wherein the first impurity region has a first region and a second region deeper than the first region, and the second impurity region overlaps the entire first region and a part of the second region in plan view.

7. The power semiconductor device according to claim 6, further comprising a third impurity region of the second conductivity type, provided below the trench, wherein the second region of the first impurity region is in contact with the third impurity region.

8. A power conversion device comprising:

a conversion circuit including a power semiconductor device according to claim 1, and configured to convert and output input power;

a drive circuit configured to output a drive signal for driving the power semiconductor device to the power semiconductor device; and a control circuit configured to output a control signal for controlling the drive circuit to the drive circuit.

9. The power semiconductor device according to claim 1, further comprising an upper surface electrode covering the first impurity region and the second impurity region, wherein the upper surface electrode includes a first upper surface electrode formed on upper surfaces of the first impurity region and the second impurity region, and a second upper surface electrode formed on the first upper surface electrode.

10. The power semiconductor device according to claim 1, wherein the upper surface of the gate electrode, other than the pointed end V-shaped groove, is inclined downward from an end of the gate electrode to a boundary with the pointed end V-shaped groove, and an inclination angle is continuously reduced from the end of the gate electrode to the boundary with the pointed end V-shaped groove.

11. A method of manufacturing a power semiconductor device, comprising the steps of:

forming a drift layer of a first conductive type on a SiC substrate;

forming a first impurity region of a second conductivity type different from the first conductivity type in a surface layer of the drift layer;

selectively forming a second impurity region of the first conductivity type in a surface layer of the first impurity region;

forming a trench extending through the first impurity region and the second impurity region and reaching the drift layer, wherein the trench has a bottom surface that is at least partially flat;

in the trench, forming a gate electrode having a pointed end V-shaped groove on an upper surface thereof such that a bottom of the pointed end V-shaped groove is deeper than the first impurity region; and forming an oxide film on an upper surface including the groove of the gate electrode, wherein an angle of a side surface of the groove of the gate electrode with respect to a thickness direction of the power semiconductor device is 1 degree or more and 20 degrees or less.

* * * * *